United States Patent
Hebiguchi et al.

(10) Patent No.: US 9,562,932 B2
(45) Date of Patent: Feb. 7, 2017

(54) CURRENT SENSOR

(71) Applicant: ALPS ELECTRIC CO., LTD., Tokyo (JP)

(72) Inventors: Hiroyuki Hebiguchi, Miyagi-ken (JP); Isao Sato, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 154 days.

(21) Appl. No.: 14/509,889

(22) Filed: Oct. 8, 2014

(65) Prior Publication Data

US 2015/0022196 A1 Jan. 22, 2015

Related U.S. Application Data

(63) Continuation of application No. PCT/JP2013/060442, filed on Apr. 5, 2013.

(30) Foreign Application Priority Data

May 18, 2012 (JP) .................................. 2012-114812
Jul. 6, 2012 (JP) .................................. 2012-152634

(51) Int. Cl.
*G01R 19/00* (2006.01)
*G01R 15/20* (2006.01)
(Continued)

(52) U.S. Cl.
CPC ........... *G01R 19/0092* (2013.01); *G01R 15/20* (2013.01); *G01R 15/207* (2013.01); *G01R 33/07* (2013.01); *G01R 33/09* (2013.01); *G01R 1/18* (2013.01)

(58) Field of Classification Search
CPC combination set(s) only.
See application file for complete search history.

(56) References Cited

U.S. PATENT DOCUMENTS

| 7,248,045 B2* | 7/2007 | Shoji | B82Y 25/00 |
| | | | 324/252 |
| 2008/0309331 A1* | 12/2008 | Qian | B82Y 25/00 |
| | | | 324/252 |
| 2012/0306488 A1* | 12/2012 | Chen | G01R 33/096 |
| | | | 324/252 |

FOREIGN PATENT DOCUMENTS

| JP | 2007-101252 | 4/2007 |
| JP | 2007-108069 | 4/2007 |

(Continued)

OTHER PUBLICATIONS

Search Report in International Application No. PCT/JP2013/060442 dated Jul. 9, 2013.

*Primary Examiner* — Clayton E Laballe
*Assistant Examiner* — Jas Sanghera
(74) *Attorney, Agent, or Firm* — Beyer Law Group LLP

(57) ABSTRACT

A current sensor includes a folded-shaped current path including a pair of arm portions extending in parallel with each other, and a pair of magnetoelectric conversion elements provided so as to sandwich therebetween a symmetric axis passing between the pair of arm portions, the pair of magnetoelectric conversion elements being used for detecting magnetism caused by a current passing through the pair of arm portions, wherein a half-bridge circuit in which the pair of magnetoelectric conversion elements is series-connected and a signal is able to be extracted from a connection point between the pair of magnetoelectric conversion elements is formed, and sensitivity axes of the pair of magnetoelectric conversion elements are oriented in a same direction and sensitivity-influencing axes of the pair of magnetoelectric conversion elements are oriented in a same direction.

3 Claims, 20 Drawing Sheets

(51) Int. Cl.
*G01R 33/07* (2006.01)
*G01R 33/09* (2006.01)
*G01R 1/18* (2006.01)

(56) References Cited

FOREIGN PATENT DOCUMENTS

JP  2008-298761  12/2008
JP  2012-63285   3/2012

* cited by examiner

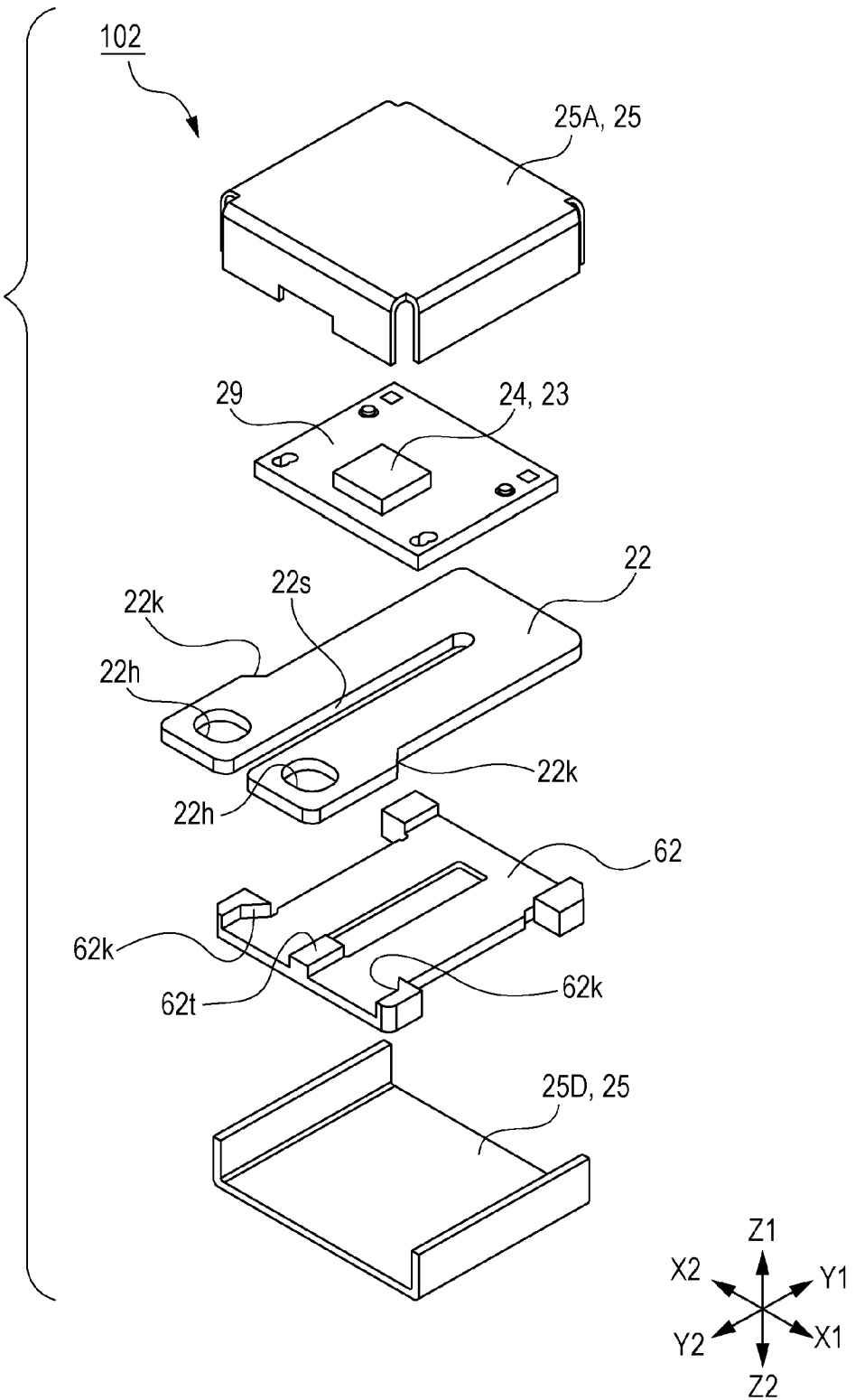

CURRENT SENSOR

CLAIM OF PRIORITY

This application is a Continuation of International Application No. PCT/JP2013/060442 filed on Apr. 5, 2013, which claims benefit of Japanese Patent Application No. 2012-114812 filed on May 18, 2012 and No. 2012-152634 filed on Jul. 6, 2012. The entire contents of each application noted above are hereby incorporated by reference.

BACKGROUND OF THE INVENTION

1. Field of the Invention

The present invention relates to a current sensor that detects a current flowing through a current path, and in particular, relates to a current sensor that detects magnetism generated when a current flows through a current path having a U-like shape.

2. Description of the Related Art

There have been well known current sensors that are each subsequently attached to an existing current path so as to control or monitor various types of device. It has been well known that, as the current sensor of this type, a magnetic sensor utilizing a magnetoelectric conversion element such as a magnetic resistance element or a Hall element, which senses a magnetic field generated from a current flowing through a current path is used.

There has been generally known a current sensor of a type out of the above-mentioned current sensors, in which a conductor (current path) having a U-like shape and a magnetic sensor are combined and fitted between current paths intended to be measured. As the current sensor of this type, such a current sensor 901 as illustrated in FIGS. 18A and 18B and FIGS. 19A and 19B has been proposed in Japanese Unexamined Patent Application Publication No. 2008-298761. FIGS. 18A and 18B are diagrams explaining the current sensor 901 of the related art, FIG. 18A is the perspective view thereof, and FIG. 18B is the cross-sectional view thereof. FIGS. 19A and 19B are diagrams explaining the current sensor 901 of the related art, FIG. 19A is a plan view illustrating a current sensing device portion 906, and FIG. 19B is a schematic configuration diagram illustrating the bridge circuit of the current sensing device portion 906.

The current sensor 901 illustrated in FIGS. 18A and 18B includes a primary conductor 903 having a U-like shape, a case 904 with a structure of being integrated with the primary conductor 903, and the current sensing device portion 906 arranged in a sensor substrate 902 provided within the case 904. In addition, if a current to be measured is applied to the primary conductor 903, induction magnetic fields M1 whose rotations are left-handed and right-handed are generated symmetrically with respect to a center line CL as illustrated in FIG. 18B, the induction magnetic fields M1 are sensed by the current sensing device portion 906, and a current flowing through the primary conductor (current path) 903 is detected.

In addition, as illustrated in FIG. 19A, in the current sensing device portion 906, four magnetoresistance effect elements (magnetic resistance elements) 911 (911a, 911b, 911c, and 911d), a connecting current line 912 for establishing connection between the magnetoresistance effect elements 911, and four terminal portions 913 (913a, 913b, 913c, and 913d) for inputting and outputting are included and provided on an installation board 914, and the magnetoresistance effect element 911a and magnetoresistance effect element 911b and the magnetoresistance effect element 911c and magnetoresistance effect element 911d are equally arranged in a line symmetrical manner in two respective regions into which the installation board 914 is divided by the center line CL.

In addition, the four magnetoresistance effect elements 911 are mutually arranged in directions parallel to the center line CL of the installation board 914, the magnetoresistance effect element 911a and the magnetoresistance effect element 911d are arranged in such orientations (DA and DD illustrated in FIG. 19A) of having magnetoresistance effect characteristics in which the resistance values thereof increase with increases in the induction magnetic fields M1, and the magnetoresistance effect element 911b and the magnetoresistance effect element 911c are arranged in such orientations (DB and DC illustrated in FIG. 19A) of having magnetoresistance effect characteristics in which the resistance values thereof decrease with increases in the induction magnetic fields M1. In addition, as illustrated in FIG. 19B, by establishing connection between the four magnetoresistance effect elements 911 (911a, 911b, 911c, and 911d) using the connecting current line 912, a bridge circuit 915 including a parallel connection of a first half-bridge circuit 916a and a second half-bridge circuit 916b is configured, the first half-bridge circuit 916a including a series connection of the magnetoresistance effect element 911a and the magnetoresistance effect element 911b, the second half-bridge circuit 916b including a series connection of the magnetoresistance effect element 911c and the magnetoresistance effect element 911d. In addition, while not illustrated, the terminal portion 913a is connected to an input terminal, the terminal portion 913b is connected to a ground terminal, and the terminal portion 913c and the terminal portion 913d are connected to signal (output) terminals.

In the current sensor 901 configured in such a way as described above, when such induction magnetic fields M1 as illustrated in FIG. 18B are generated, the directions of the induction magnetic fields M1 are opposite to each other in the first half-bridge circuit 916a and the second half-bridge circuit 916b. Therefore, the resistance values of the magnetoresistance effect element 911a and the magnetoresistance effect element 911d increase, and the resistance values of the magnetoresistance effect element 911b and the magnetoresistance effect element 911c decrease. From this, changes (increases or decreases) in respective electric potentials of an output voltage V1 from the terminal portion 913c and an output voltage V2 from the terminal portion 913d are opposite to each other. Therefore, it is possible to obtain a larger output signal by performing differential processing. In addition, in a case where external magnetic fields of the same amplitude are incident upon the four magnetoresistance effect elements 911 in the same direction, changes in the electric potentials of the output voltage V1 and the output voltage V2 are equal to each other. Therefore, it is assumed that it is possible to cancel the influences of the external magnetic fields by performing the differential processing.

By the way, as a magnetoelectric conversion element such as the above-mentioned magnetoresistance effect element 911, there is a magnetoelectric conversion element that has a sensitivity-influencing axis direction in which an output signal is influenced by reception of a magnetic field in a direction other than the sensitivity axis directions (DA, DB, DC, and DD illustrated in FIG. 19A). FIG. 20 is a diagram explaining a comparative example, and is a schematic configuration diagram compared based on the bridge circuit of the current sensing device portion illustrated in FIG. 19B. In addition, all magnetic resistance elements 93 (93A, 93B, 93C, and 93D) in the drawing illustrate a case where sensitivity-influencing axis directions (DAs, DBs, DCs, and DDs illustrated in FIG. 20) lie in directions rotated 90 degrees to the right with respect to the sensitivity axis directions (DA, DB, DC, and DD illustrated in FIG. 20).

In such a case, as illustrated in FIG. 20, if an external magnetic field MY in a Y-axis direction is incident, it is difficult to cancel the influence of the external magnetic field MY by even performing differential processing on the output voltage V1 and the output voltage V2. In other words, even if the constant induction magnetic fields M1 are generated by the current to be measured flowing through the conductor 92, the induction magnetic fields are sensed as if being further changed, owing to the external magnetic field MY in the Y-axis direction, and the value of a current flowing through the conductor 92 is detected as a different value. In this way, in a case where the magnetic resistance elements 93 having the sensitivity-influencing axis directions are used, it is difficult for the configuration of the related art to cancel the influence of the external magnetic field MY, and there has been a problem that it is difficult to obtain a current sensor having good accuracy.

The present invention solves the above-mentioned problem, and provides a current sensor in which the influence of an external magnetic field is reduced to obtain good detection accuracy.

SUMMARY OF THE INVENTION

The present invention provides a current sensor including a folded-shaped current path including a pair of arm portions extending in parallel with each other, and a pair of magnetoelectric conversion elements provided so as to sandwich therebetween a symmetric axis passing between the pair of arm portions, the pair of magnetoelectric conversion elements being used for detecting magnetism caused by a current passing through the pair of arm portions, wherein a half-bridge circuit in which the pair of magnetoelectric conversion elements is series-connected and a signal is able to be extracted from a connection point between the pair of magnetoelectric conversion elements is formed, and sensitivity axes of the pair of magnetoelectric conversion elements are oriented in a same direction and sensitivity-influencing axes of the pair of magnetoelectric conversion elements are oriented in a same direction.

According to this, in the current sensor provided by the present invention, the sensitivity axes of the individual magnetoelectric conversion elements configuring the half-bridge circuit are oriented in a same direction, and induction magnetic fields caused by the current passing through the pair of arm portions are applied to the individual magnetoelectric conversion elements in directions opposite to each other. Therefore, the fluctuation of an electric potential in the output voltage of the half-bridge circuit becomes large, and it is possible to obtain a large output signal. Furthermore, since the sensitivity-influencing axes of the individual magnetoelectric conversion elements configuring the half-bridge circuit are oriented in a same direction, it is possible to align the amplitudes of the fluctuations of resistance values dependent on the sensitivity-influencing axis direction component of an external magnetic field, in the pair of magnetoelectric conversion elements within the half-bridge circuit.

In addition, in the current sensor provided by the present invention, the sensitivity-influencing axes of the magnetoelectric conversion elements may be oriented in a direction of a bias magnetic field.

According to this, since the sensitivity-influencing axes of the individual magnetoelectric conversion elements are oriented in the direction of the bias magnetic field, it is possible to align the amplitudes of the fluctuations of resistance values dependent on the bias magnetic field, in the pair of magnetoelectric conversion elements within the half-bridge circuit.

In addition, in the current sensor provided by the present invention, the two half-bridge circuits may be included, a full-bridge circuit may be formed from the two half-bridge circuits, and sensitivity axes of a pair of magnetoelectric conversion elements in one half-bridge circuit may be oriented in a direction opposite to a direction in which sensitivity axes of a pair of magnetoelectric conversion elements in the other half-bridge circuit are oriented.

According to this, in the current sensor provided by the present invention, since the sensitivity axes of the individual magnetoelectric conversion elements in one half-bridge circuit are oriented in a direction opposite to a direction in which the sensitivity axes of the individual magnetoelectric conversion elements in the other half-bridge circuit are oriented, changes (increases or decreases) in the output voltages of the individual half-bridge circuits are opposite to each other. Therefore, it is possible to obtain a larger output signal by performing differential processing. Furthermore, since the sensitivity axes of the individual magnetoelectric conversion elements configuring each of the half-bridge circuits are oriented in a same direction, it is possible to align the fluctuations of resistance values, caused by the sensitivity-influencing axis direction component of the external magnetic field. Therefore, voltage fluctuations caused by the sensitivity-influencing axis direction component of the external magnetic field are cancelled out by differential processing, the influence of the external magnetic field is reduced, and it is possible to obtain the current sensor whose detection accuracy is good.

In addition, the current sensor provided by the present invention may further include a magnetic shielding member blocking an external magnetic field entering the magnetoelectric conversion elements from the sensitivity axis direction.

According to this, using the magnetic shielding member, it is possible to block the external magnetic field entering from the sensitivity axis direction, which has the most influence on a sensitivity. Furthermore, the intensity of the external magnetic field entering from a direction perpendicular to the sensitivity axis direction changes depending on the distance thereof, and the direction of the external magnetic field is aligned if the external magnetic field moves far away from an incident position. From this, the external magnetic fields of the same amplitude are incident upon the individual magnetoelectric conversion elements configuring each of the first half-bridge circuit and the second half-bridge circuit, in approximately parallel with each other. From this, even in a case where the external magnetic fields are incident upon the plural magnetoelectric conversion elements while, for example, the generation source of the external magnetic fields exits near the plural magnetoelectric conversion elements, the voltage fluctuations of the sensitivity-influencing axis direction components of the external magnetic fields in the bridge circuit or the half-bridge circuits are cancelled out, and it is possible to obtain the current sensor whose detection accuracy is further enhanced.

BRIEF DESCRIPTION OF THE DRAWINGS

FIG. 8 is an exploded perspective view explaining a current sensor of a second embodiment of the present invention;

FIG. 18A is a perspective view thereof, and FIG. 18B is a cross-sectional view thereof;

FIG. 19A is a plan view illustrating a current sensing device portion, and FIG. 19B is a schematic configuration diagram illustrating a bridge circuit of the current sensing device portion.

DESCRIPTION OF THE PREFERRED EMBODIMENTS

Hereinafter, embodiments of the present invention will be described with reference to drawings. In addition, in the present invention, as a magnetoelectric conversion element, a magnetic resistance element or a Hall element may be used. The magnetic resistance element is a magnetoelectric conversion element utilizing a magnetoresistance effect, and the Hall element is a magnetoelectric conversion element utilizing the Hall effect. In addition, as the magnetoelectric conversion element, an element having a sensitivity-influencing axis is used. Here, the sensitivity-influencing axis is an axis influencing the measurement accuracy of a current to be measured, in addition to a sensitivity axis. As the sensitivity-influencing axis, a sub-sensitivity axis possessed by a magnetic resistance element whose detection sensitivity is high or a Hall element equipped with a magnetic concentrator plate or a sensitivity variation axis possessed by a magnetic resistance element equipped with a hard bias layer may be cited.

In addition, the sub-sensitivity axis is an axis in which an output signal relatively low compared to an output signal based on the sensitivity axis is generated by an induction magnetic field from the current to be measured. In addition, the sensitivity variation axis is the axis of the direction of a bias magnetic field from a hard bias layer for the magnetic resistance element.

First Embodiment

Figure 1:
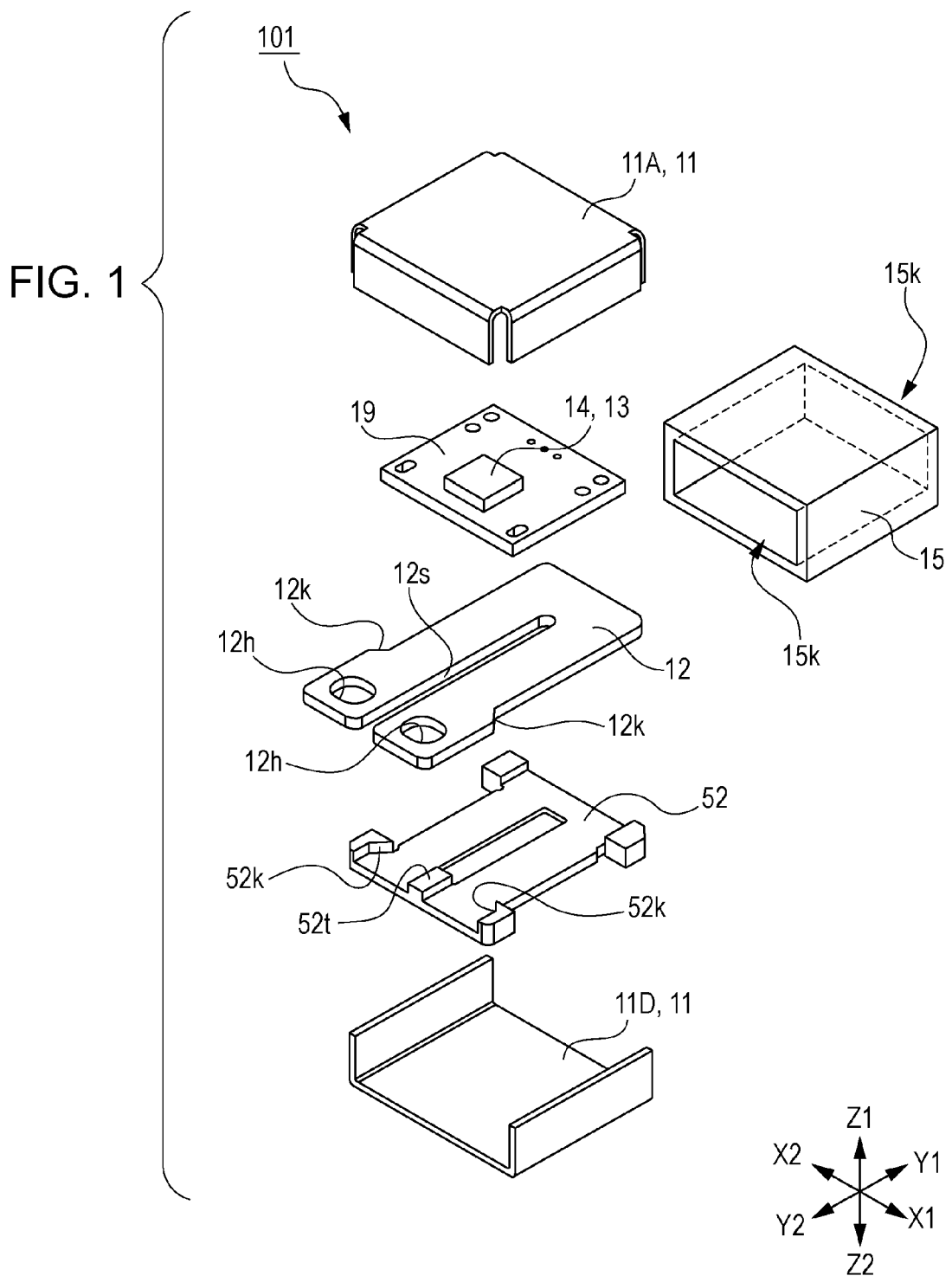
FIG. 1 is an exploded perspective view explaining a current sensor of a first embodiment of the present invention.
Figure 2:
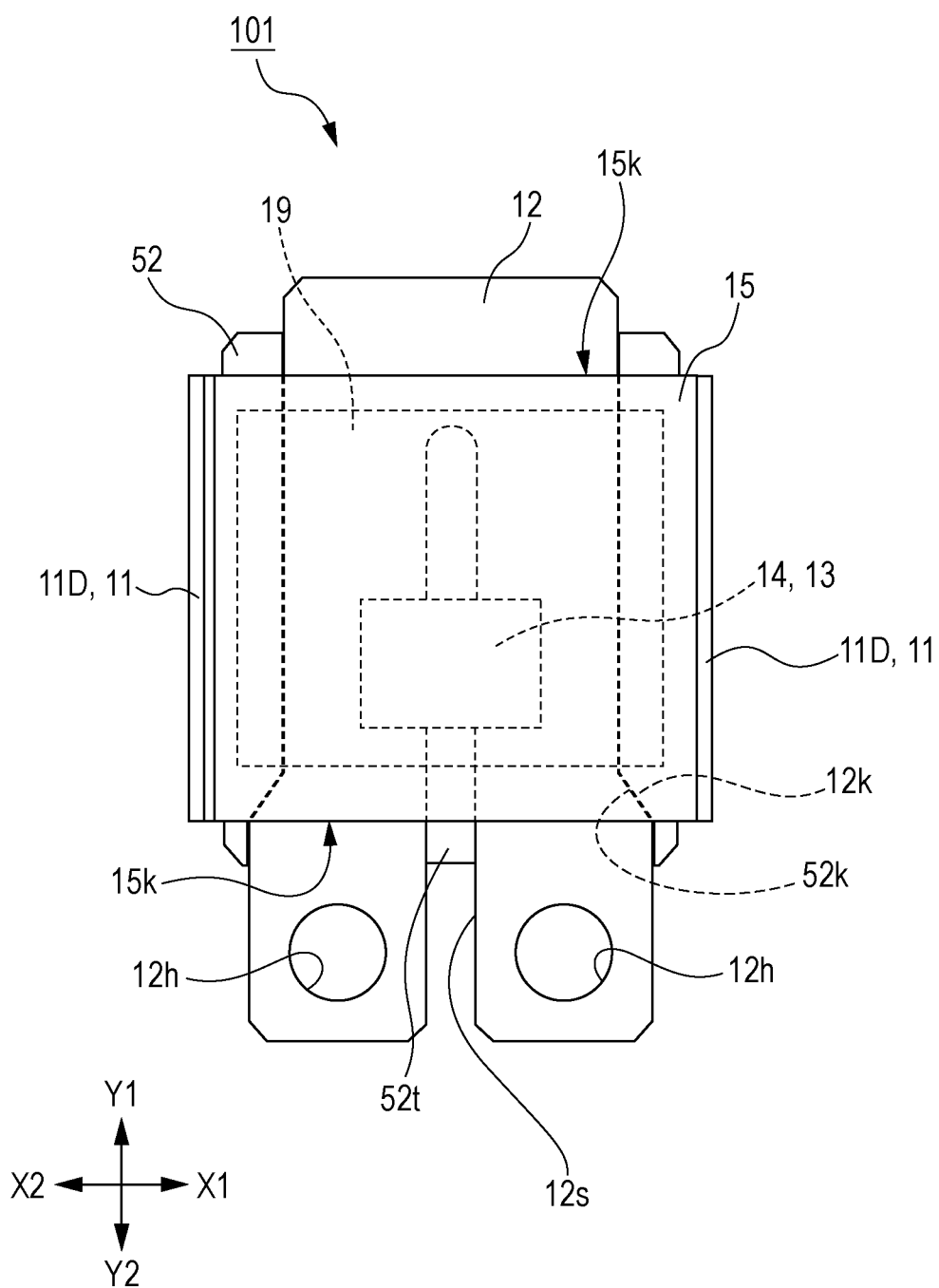
FIG. 2 is a diagram explaining the current sensor of the first embodiment of the present invention, and is a top view viewed from a Z1 side illustrated in FIG. 1.
Figure 3:
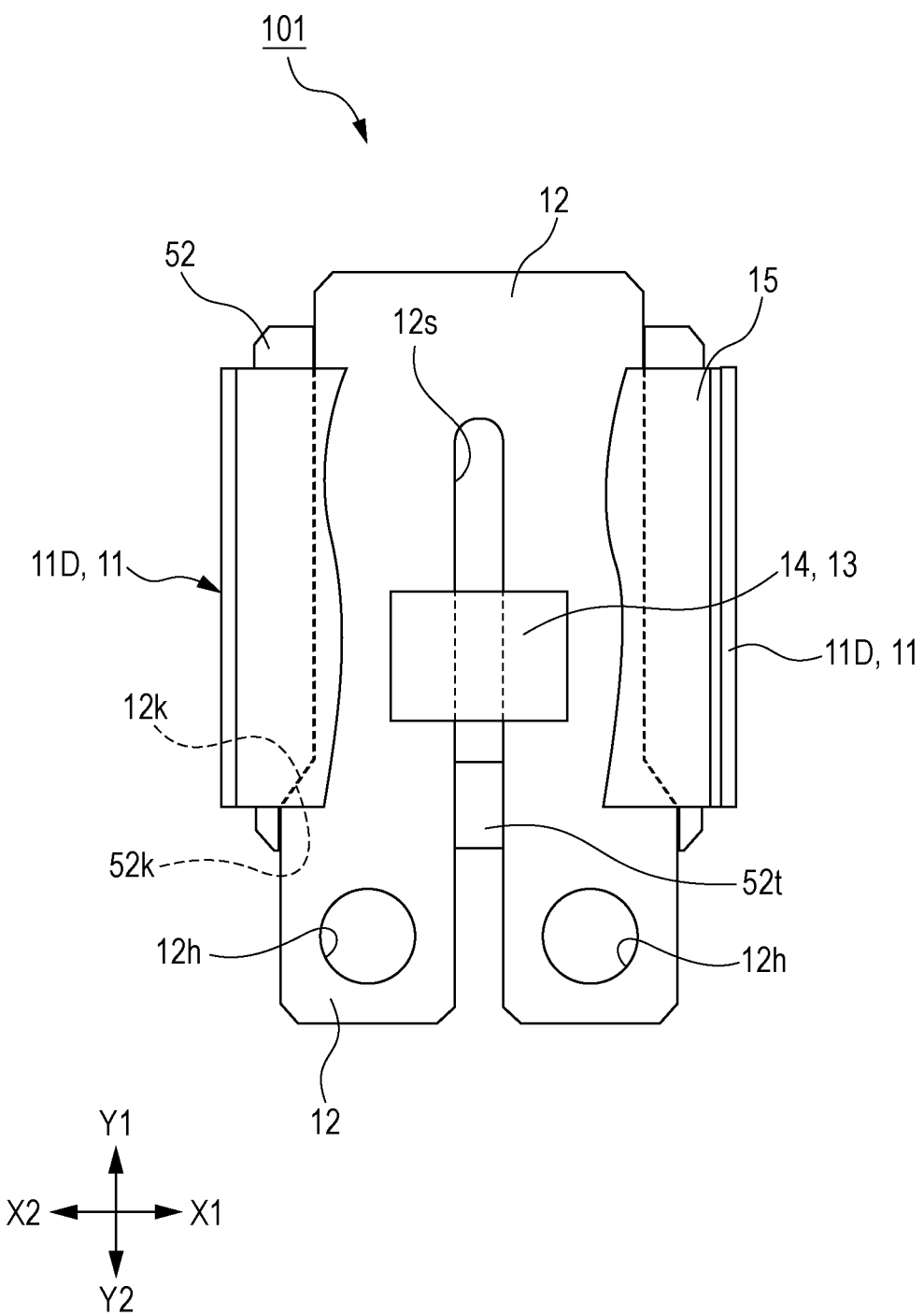
FIG. 3 is a diagram explaining the current sensor of the first embodiment of the present invention, and is a top view in which part of FIG. 2 is omitted.
Figure 4:
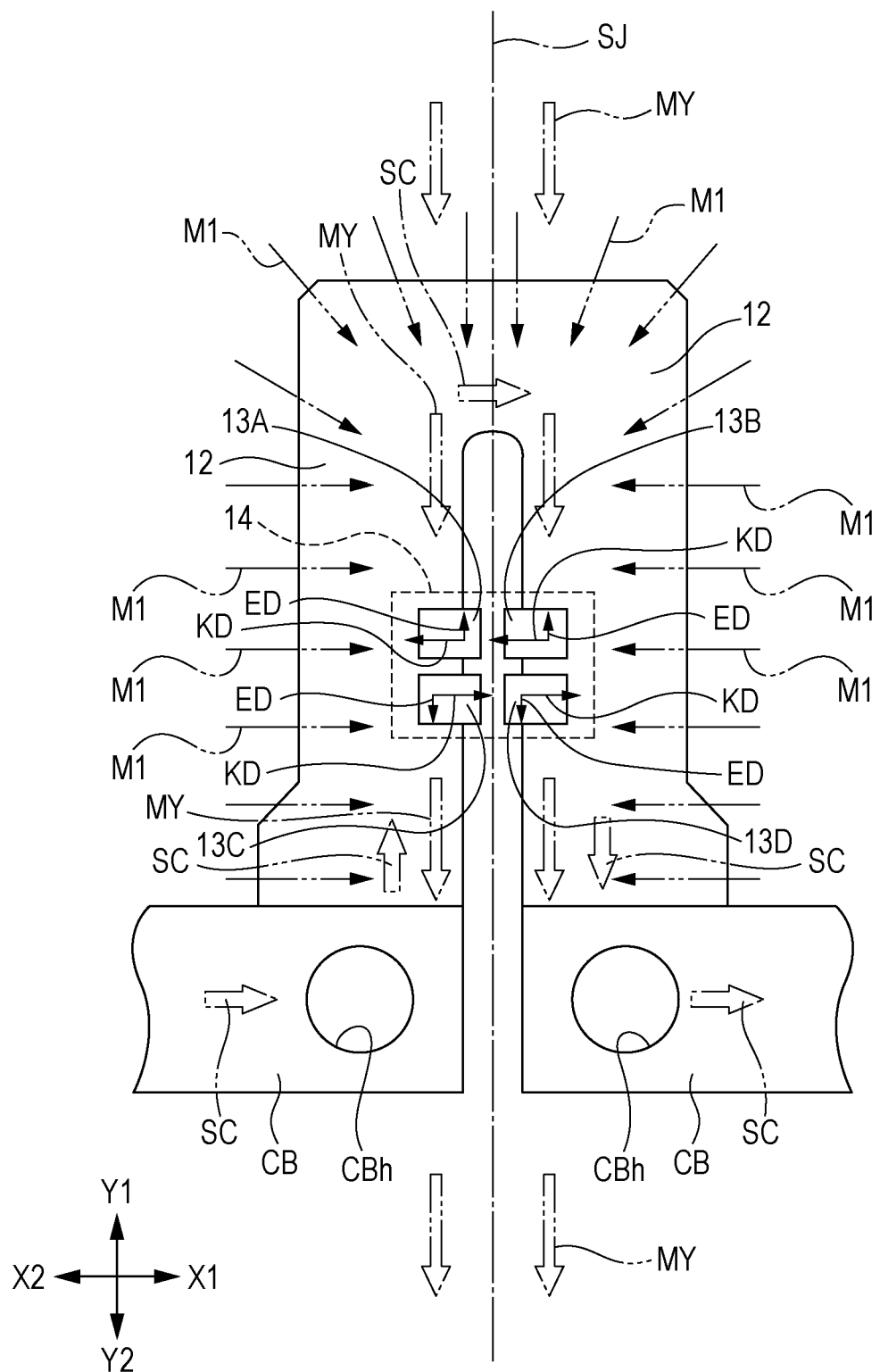
FIG. 4 is a configuration diagram explaining the current sensor of the first embodiment of the present invention, and is a plan view illustrating a current path and magnetoelectric conversion elements.
Figure 5:
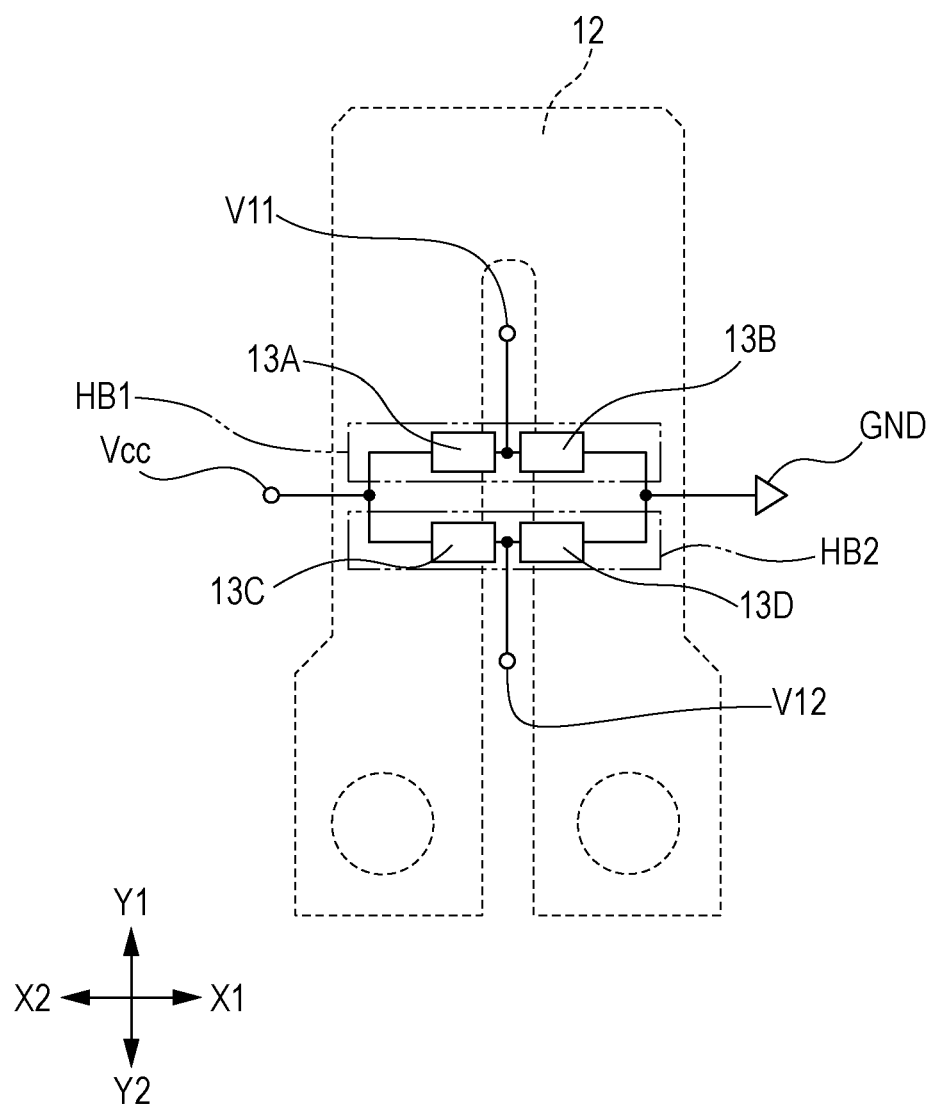
FIG. 5 is a configuration diagram explaining the current sensor of the first embodiment of the present invention, and is a diagram schematically illustrating a bridge circuit in FIG. 4.
Figure 6:
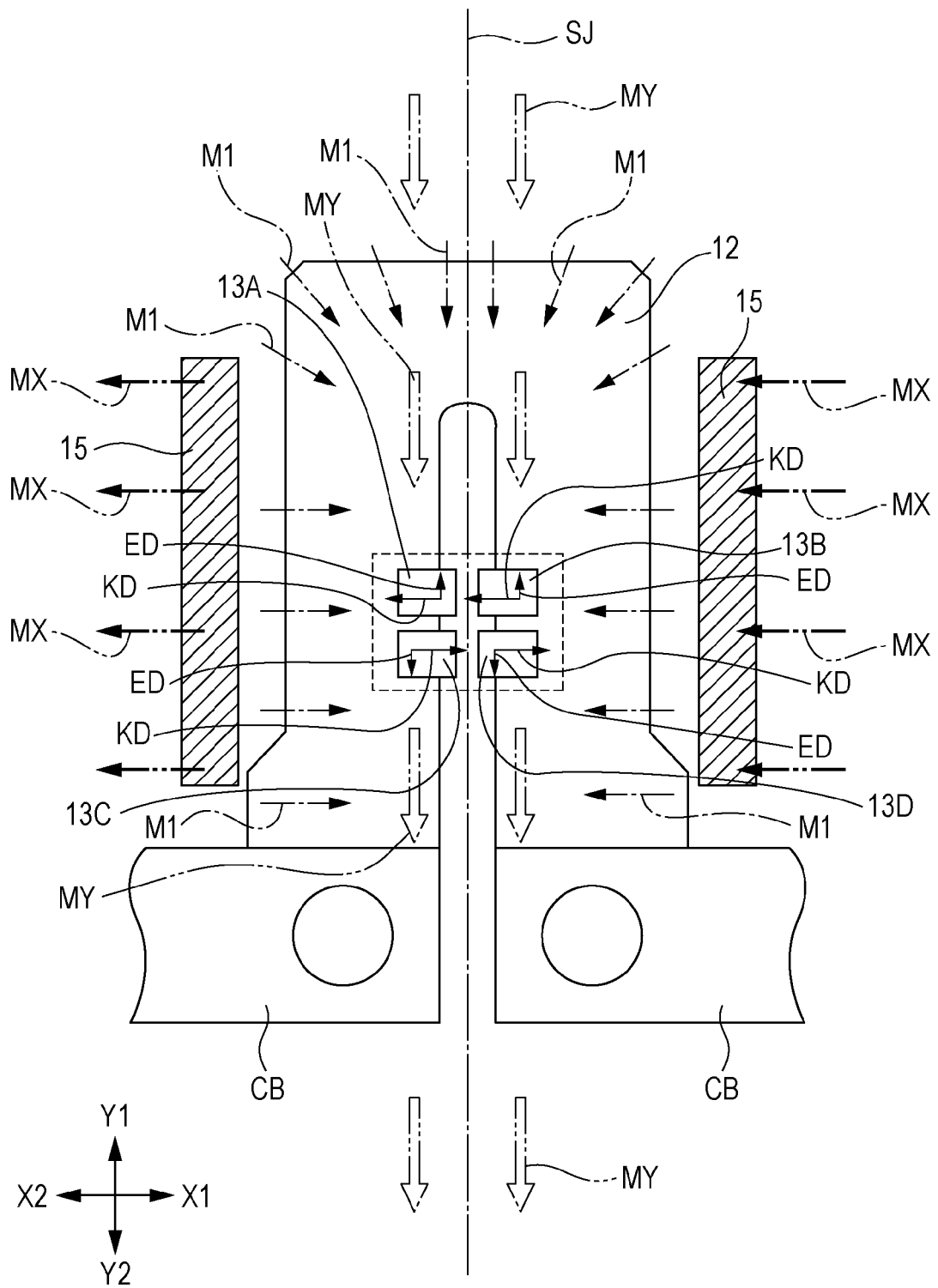
FIG. 6 is a configuration diagram explaining the current sensor of the first embodiment of the present invention, and is a diagram schematically illustrating a magnetic shielding member and external magnetic fields.

FIG. 1 is an exploded perspective view explaining a current sensor 101 of a first embodiment of the present invention. FIG. 2 is a diagram explaining the current sensor 101 of the first embodiment of the present invention, and is a top view viewed from a Z1 side illustrated in FIG. 1. In addition, for ease of explanation, an upper case 11A is omitted. FIG. 3 is a diagram explaining the current sensor 101 of the first embodiment of the present invention, and is a top view in which part of a magnetic shielding member 15 and a substrate 19 in FIG. 2 are omitted. FIG. 4 is a configuration diagram explaining the current sensor of the first embodiment of the present invention, and is a plan view illustrating a current path 12 and magnetoelectric conversion elements 13. FIG. 5 is a configuration diagram explaining the current sensor of the first embodiment of the present invention, and is a diagram schematically illustrating a bridge circuit in FIG. 4. FIG. 6 is a configuration diagram explaining the current sensor of the first embodiment of the present invention, and is a diagram schematically illustrating the magnetic shielding member 15 and external magnetic fields (MX and MY). Note that, for ease of explanation, the magnetic shielding member 15 is illustrated using only the cross-section thereof.

As illustrated in FIG. 1 to FIG. 4, the current sensor 101 of the first embodiment of the present invention may include a current path 12 having a U-like shape whose one end is open, a plurality of magnetoelectric conversion elements 13 for detecting magnetism generated when a current flows through the current path 12, a circuit (not illustrated) configured to establish connection between the plural magnetoelectric conversion elements 13, and the magnetic shielding member 15 provided on the outer side of the U-like shape of the current path 12. In addition to these, the substrate 19 having a wiring pattern for establishing connection between the plural magnetoelectric conversion elements 13, a supporting member 52 for positioning and supporting the current path 12, and a chassis 11 containing the current path 12, the magnetoelectric conversion elements 13, the magnetic shielding member 15, the substrate 19, and the supporting member 52 may be provided.

The current path 12 utilizes a material such as copper (Cu) whose conductivity is good, and has the U-like shape whose one end is open as illustrated in FIG. 1 to FIG. 3, and holes 12h for connecting and being fixed to a current path to be measured (a current path intended to be measured) CB illustrated in FIG. 4 are provided on the leading end side of the U-like shape. While not illustrated, connection and fixation of the current path 12 to the current path to be measured CB are able to be easily achieved by overlaying holes CBh on a current path to be measured CB side and the holes 12h of the current path 12 on each other and using bolts and nuts or the like. In addition, while copper (Cu) is used as the material of the current path 12, the material of the current path 12 is not limited to this, a material whose conductivity is good may be used, and, for example, aluminum (Al) or the like may be used.

In addition, the current path 12 is contained in the groove of the supporting member 52, inclined portions 12k formed on the right and left outer side portions of the current path 12 and inclined walls 52k formed on the right and left inner side portions of the supporting member 52 are caused to come into contact with each other, a projecting portion 52t of the supporting member 52 is fitted into a slit portion 12s of the current path 12, and thus, the positioning of the current path 12 is accurately performed.

In addition, the supporting member 52 utilizes a synthetic resin material such as acrylonitrile butadiene styrene (ABS), polyethylene terephthalate (PET), polybutylene terephthalate (PBT), or liquid crystalline polymer (LCP). Since the synthetic resin material is used, the supporting member 52 is able to be easily manufactured using injection molding or the like.

The magnetoelectric conversion elements 13 are elements that each detect magnetism generated when a current flows through the current path 12, and four magnetoelectric conversion elements 13 are provided using, for example, magnetic resistance elements (called GMR (Giant Magneto Resistive) elements) utilizing a giant magnetoresistance effect, as illustrated in FIG. 4. In addition, while, for ease of explanation, the four magnetoelectric conversion elements 13 (13A, 13B, 13C, and 13D) are not illustrated in detail, after the GMR elements are manufactured on a silicon substrate, a chip of the GMR elements cut out and lead terminals for extracting a signal are electrically connected to each other, subjected to packaging using a thermosetting synthetic resin, and formed into a magnetic sensor package 14 illustrated in FIG. 1. In addition, the magnetic sensor package 14 is soldered to the substrate 19 by lead terminals not illustrated, and provided astride the slit portion 12s of the U-like shape of the current path 12. In this way, since the magnetoelectric conversion elements 13 are extracted from the same silicon substrate, the element characteristics thereof are easily uniformed.

In addition, as illustrated in FIG. 4, a first magnetoelectric conversion element 13A and a second magnetoelectric conversion element 13B out of the plural magnetoelectric conversion elements 13 may be individually provided so as to sandwich therebetween a symmetric axis SJ of the U-like shape of the current path 12, and a third magnetoelectric conversion element 13C and a fourth magnetoelectric conversion element 13D may be individually provided so as to sandwich therebetween the symmetric axis SJ of the U-like shape of the current path 12. In addition, as illustrated in FIG. 4, the sensitivity axis directions KD of the first magnetoelectric conversion element 13A and the second magnetoelectric conversion element 13B may be oriented in a same direction (an X2 direction in FIG. 4), and the sensitivity-influencing axis directions ED of the first magnetoelectric conversion element 13A and the second magnetoelectric conversion element 13B may be oriented in a same direction (a Y1 direction in FIG. 4). On the other hand, the sensitivity axis directions KD of the third magnetoelectric conversion element 13C and the fourth magnetoelectric conversion element 13D may be oriented in a same direction, and the sensitivity-influencing axis directions ED of the third magnetoelectric conversion element 13C and the fourth magnetoelectric conversion element 13D may be oriented in a same direction. In addition, the sensitivity axis directions KD of the first and second electromagnetic conversion elements 13A and 13B may be oriented in a direction opposite to a direction in which the sensitivity axis directions KD of the third and fourth electromagnetic conversion elements 13C and 13D are oriented. In addition, while, in the first embodiment, a case where an angle between the sensitivity axis direction KD and the sensitivity-influencing axis direction ED is 90 degrees has been described, the angle is not limited to 90 degrees.

In addition, in the current sensor 101 of the first embodiment of the present invention, the sensitivity-influencing axis directions ED may be the directions of biases applied to the plural magnetoelectric conversion elements 13.

The four magnetoelectric conversion elements 13 (13A, 13B, 13C, and 13D) provided as above are electrically connected, and such a circuit as illustrated in FIG. 5 is created. As illustrated in FIG. 5, this circuit may configure a first half-bridge circuit HB1 using the first magnetoelectric conversion element 13A and the second magnetoelectric conversion element 13B, configure a second half-bridge circuit HB2 using the third magnetoelectric conversion element 13C and the fourth magnetoelectric conversion element 13D, and configure a bridge circuit including a parallel connection of the first half-bridge circuit HB1 and the second half-bridge circuit HB2. In addition, while not illustrated, individual terminal portions are connected to an input terminal, a ground terminal, and signal (output) terminals, and function as a control power-supply voltage Vcc, a ground GND, an output voltage V11, and an output voltage V12, and the circuit is configured as illustrated in FIG. 5.

In the current sensor 101 of the present invention configured as above, as illustrated in, FIG. 4 and FIG. 5, when a current to be measured SC is applied and induction magnetic fields M1 are generated, the sensitivity axis directions KD of the first magnetoelectric conversion element 13A and the second magnetoelectric conversion element 13B within the first half-bridge circuit HB1 are oriented in a same direction. Therefore, the induction magnetic fields M1 applied in the sensitivity axis direction KD of the first magnetoelectric conversion element 13A and the sensitivity axis direction KD of the second magnetoelectric conversion element 13B are oriented in directions opposite to each other. Therefore, the resistance value of the first magnetoelectric conversion element 13A increases, and the resistance value of the second magnetoelectric conversion element 13B decreases. In the same way, the sensitivity axis directions KD of the third magnetoelectric conversion element 13C and the fourth magnetoelectric conversion element 13D within the second half-bridge circuit HB2 are oriented in a same direction. Therefore, the induction magnetic fields M1 applied in the sensitivity axis direction KD of the third magnetoelectric conversion element 13C and the sensitivity axis direction KD of the fourth magnetoelectric conversion element 13D are oriented in directions opposite to each other. In this case, since the sensitivity axis directions of the third and fourth magnetoelectric conversion elements 13C and 13D are opposite to the sensitivity axis directions of the first and second magnetoelectric conversion elements 13A and 13B, the resistance value of the fourth magnetoelectric conversion element 13D increases, and the resistance value of the third magnetoelectric conversion element 13C decreases. From this, changes (increases or decreases) in the respective electric potentials of the output voltage V11 and the output voltage V12 are opposite to each other. Therefore, it is possible to obtain a large output signal by performing differential processing. In addition, in a case where external magnetic fields of the same amplitude are incident upon the four magnetoelectric conversion elements 13 in the same direction, changes in the electric potentials of the output voltage V11 and the output voltage V12 are equal to each other. Therefore, it is possible to cancel the influences of the external magnetic fields by performing the differential processing.

In addition, as illustrated in FIG. 4, in a case where the external magnetic field MY in a Y-axis direction is incident, the sensitivity-influencing axis directions ED of the first magnetoelectric conversion element 13A and the second magnetoelectric conversion element 13B are oriented in a same direction. Therefore, upon receiving the external magnetic field MY oriented in a direction opposite to the sensitivity-influencing axis directions ED, the respective sensitivities of the first magnetoelectric conversion element 13A and the second magnetoelectric conversion element 13B increase, and the respective resistance values thereof change. In this case, the induction magnetic fields M1 applied to the first magnetoelectric conversion element 13A and the second magnetoelectric conversion element 13B are oriented in directions opposite to each other. Therefore, the resistance value of the first magnetoelectric conversion element 13A and the resistance value of the second magnetoelectric conversion element 13B are caused to change in directions opposite to each other by the influence of the external magnetic field MY. Specifically, if the sensitivity of the first magnetoelectric conversion element 13A is caused to increase by the external magnetic field MY, a resistance increase rate indicating a change in the increasing direction of a resistance value corresponding to the induction magnetic field M1 increases. If the sensitivity of the second magnetoelectric conversion element 13B is caused to increase by the external magnetic field MY, a resistance decrease rate indicating a change in the decreasing direction of a resistance value corresponding to the induction magnetic field M1 increases.

On the other hand, the sensitivity-influencing axis directions ED of the third magnetoelectric conversion element 13C and the fourth magnetoelectric conversion element 13D are oriented in a same direction. Therefore, upon receiving the external magnetic field MY oriented in a direction equal to the sensitivity-influencing axis directions ED, the respective sensitivities of the third magnetoelectric conversion element 13C and the fourth magnetoelectric conversion element 13D decrease, and the respective resistance values thereof change. In this case, the induction magnetic fields M1 applied to the third magnetoelectric conversion element 13C and the fourth magnetoelectric conversion element 13D are oriented in directions opposite to each other. Therefore, the resistance value of the third magnetoelectric conversion element 13C and the resistance value of the fourth magnetoelectric conversion element 13D are caused to change in directions opposite to each other by the influence of the external magnetic field MY. Specifically, if the sensitivity of the third magnetoelectric conversion element 13C is caused to increase by the external magnetic field MY, a resistance decrease rate indicating a change in the decreasing direction of a resistance value corresponding to the induction magnetic field M1 decreases. If the sensitivity of the fourth magnetoelectric conversion element 13D is caused to decrease by the external magnetic field MY, a resistance increase rate indicating a change in the increasing direction of a resistance value corresponding to the induction magnetic field M1 decreases.

From this, since the resistance value fluctuations of the first half-bridge circuit HB1 and the second half-bridge circuit HB2, caused by the external magnetic field MY, become equal to each other, the external magnetic field MY in the Y-axis direction does not influence. In other words, even if the external magnetic field reaches the current sensor 101, the voltage fluctuations of sensitivity-influencing axis direction components (here, Y-axis direction components) in the bridge circuit are cancelled out by performing a differential operation on output signals from the first half-bridge circuit HB1 and the second half-bridge circuit HB2. From this, the influence of the external magnetic field is reduced, and it is possible to obtain the current sensor 101 whose detection accuracy is good.

Here, the differential processing performed on the first half-bridge circuit HB1 and the second half-bridge circuit HB2 will be described in detail with reference to FIGS. 7A to 7C. In addition, FIGS. 7A and 7B each illustrate a bridge circuit according to a comparative example, and FIG. 7C illustrate a bridge circuit according to the present embodiment. In addition, magnetoelectric conversion elements having no sensitivity-influencing axis are used in the bridge circuit in FIG. 7A, and magnetoelectric conversion elements having sensitivity-influencing axes are used in the bridge circuit in FIG. 7B. In addition, in the following description, for the purpose of illustration, it is assumed that the output voltages of respective half-bridge circuits are $V_1'$ and $V_2'$.

Figure 7A:
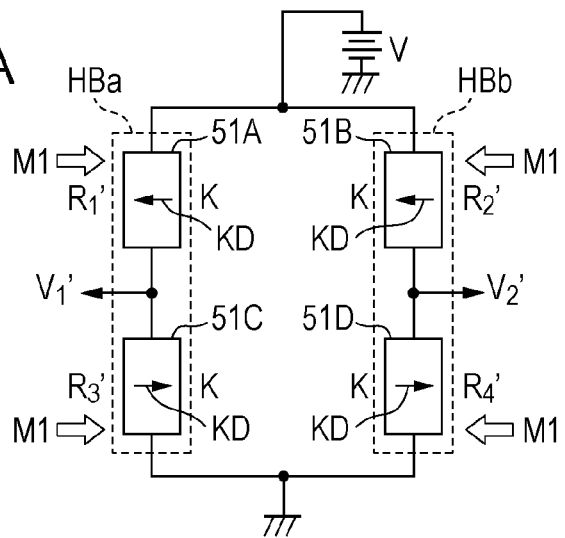
FIGS. 7A to 7C are configuration diagrams explaining the current sensor of the first embodiment of the present invention, and are explanatory diagrams of differential processing.

As illustrated in FIG. 7A, in the bridge circuit according to the comparative example, a first half-bridge circuit HBa is configured using a first magnetoelectric conversion element 51A and a third magnetoelectric conversion element 51C, and a second half-bridge circuit HBb is configured using a second magnetoelectric conversion element 51B and a fourth magnetoelectric conversion element 51D. In this bridge circuit, the resistance values $R_1'$ to $R_4'$ of the first to fourth magnetoelectric conversion elements 51A to 51D are expressed as the following Expression (1). Here, R indicates a resistance value, K indicates a sensitivity, X indicates the amplitude of a magnetic field, and $R_0$ indicates the resistance value of a zero magnetic field. In addition, +ΔR indicates a resistance increase rate, and −ΔR indicates a resistance decrease rate.

$$R_1' = R_1 + \triangle R = R_1 + R_1 KX = R_1(1 + KX) \quad (1)$$
$$R_2' = R_2 - \triangle R = R_2 - R_2 KX = R_2(1 - KX)$$
$$R_3' = R_3 - \triangle R = R_3 - R_3 KX = R_3(1 - KX)$$
$$R_4' = R_4 + \triangle R = R_4 + R_4 KX = R_4(1 + KX)$$

$\begin{bmatrix} R_1 = R_2 = R_3 = R_4 = R_0 \\ \text{sensitivity} = K \\ \triangle R = RKX \end{bmatrix}$ In this case, since each of the sensitivity axes KD of the first and fourth magnetoelectric conversion elements 51A and 51D is oriented in a direction opposite to that of the induction magnetic field M1, the resistance values $R_1'$ and $R_4'$ of the first and fourth magnetoelectric conversion elements 51A and 51D change in an increasing direction. Since each of the sensitivity axes KD of the second and third magnetoelectric conversion elements 51B and 51C is oriented in a direction equal to that of the induction magnetic field M1, the resistance values $R_2'$ and $R_3'$ of the second and third magnetoelectric conversion elements 51B and 51C change in a decreasing direction.

In addition, the output voltage $V_1'$ of the first half-bridge circuit HBa and the output voltage $V_2'$ of the second half-bridge circuit HBb are expressed as the following Expression (2).

$$V_1' = \frac{R_3'}{R_1' + R_3'}V = \frac{R_3(1-KX)}{R_1(1+KX) + R_3(1-KX)}V = \frac{1-KX}{2}V \quad (2)$$

$$V_2' = \frac{R_4'}{R_2' + R_4'}V = \frac{R_4(1+KX)}{R_2(1-KX) + R_4(1+KX)}V = \frac{1+KX}{2}V$$

In addition, by performing a differential operation on the output $V_1'$ of the first half-bridge circuit HBa and the output $V_2'$ of the second half-bridge circuit HBb, it is possible to obtain an output signal as illustrated in the following Expression (3).

$$V_1' - V_2' = \frac{1-KX}{2}V - \frac{1+KX}{2}V = KXV \quad (3)$$

In this way, in a case where the magnetoelectric conversion elements having no sensitivity-influencing axis are used, it is possible to obtain an output proportional to the amplitude X of the induction magnetic field M1.

Figure 7B:
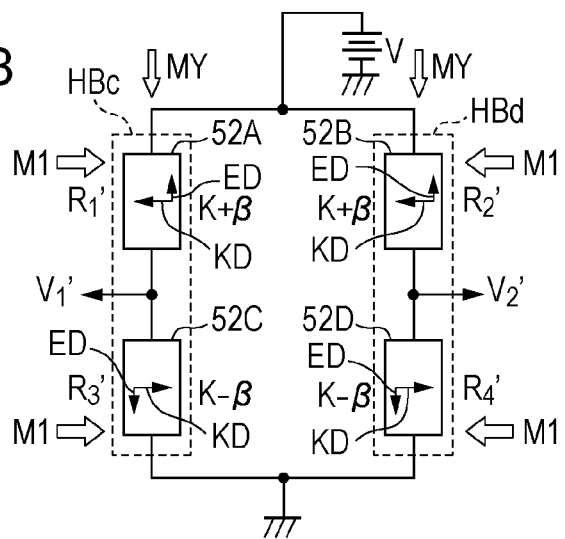
Figure 7C:
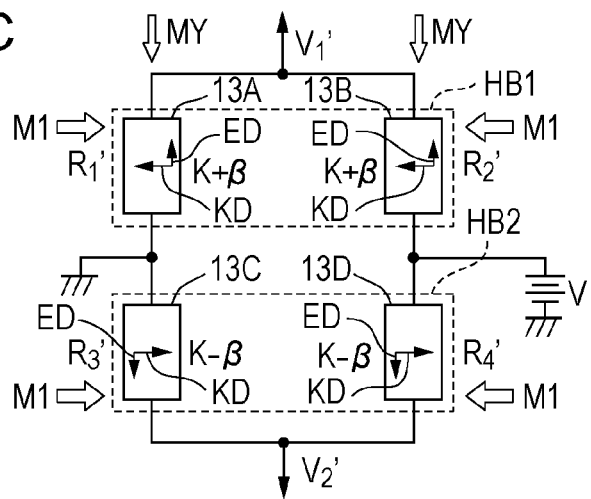

However, in a case where, as the comparative example illustrated in FIG. 7B, magnetoelectric conversion elements having sensitivity-influencing axes are used, the influence of the external magnetic field MY applied in the sensitivity-influencing axis directions of the magnetoelectric conversion elements becomes a problem. In this comparative example, a first half-bridge circuit HBc is configured using a first magnetoelectric conversion element 52A and a third magnetoelectric conversion element 52C, and a second half-bridge circuit HBd is configured using a second magnetoelectric conversion element 52B and a fourth magnetoelectric conversion element 52D. In this bridge circuit, the resistance values $R_1'$ to $R_4'$ of the first to fourth magnetoelectric conversion elements 52A to 52D are expressed as the following Expression (4). Here, R indicates a resistance value, K indicates a sensitivity, β indicates the amount of change in the sensitivity, X indicates the amplitude of a magnetic field, and $R_0$ indicates the resistance value of a zero magnetic field. In addition, +ΔR indicates a resistance increase rate, and −ΔR indicates a resistance decrease rate.

$$R_1' = R_1 + \triangle R \quad (4)$$
$$= R_1 + R_1(K + \beta)X$$
$$= R_1[1 + (K + \beta)X]$$
$$R_2' = R_2 - \triangle R$$
$$= R_2 - R_2(K + \beta)X$$
$$= R_2[1 - (K + \beta)X] \begin{bmatrix} R_1 = R_2 = R_3 = R_4 = R_0 \\ \text{sensitivity} = K + \beta \text{ or } K - \beta \end{bmatrix}$$
$$R_3' = R_3 - \triangle R$$
$$= R_3 - R_3(K - \beta)X$$
$$= R_3[1 - (K - \beta)X]$$
$$R_4' = R_4 + \triangle R$$
$$= R_4 + R_4(K - \beta)X$$
$$= R_4[1 + (K - \beta)X]$$

In this case, since each of the sensitivity axes KD of the first and fourth magnetoelectric conversion elements 52A and 52D is oriented in a direction opposite to that of the induction magnetic field M1, the resistance values $R_1'$ and $R_4'$ of the first and fourth magnetoelectric conversion elements 52A and 52D change in an increasing direction. Since each of the sensitivity axes KD of the second and third magnetoelectric conversion elements 52B and 52C is oriented in a direction equal to that of the induction magnetic field M1, the resistance values $R_2'$ and $R_3'$ of the second and third magnetoelectric conversion elements 52B and 52C change in a decreasing direction. In addition, since the sensitivity-influencing axes ED of the first and second magnetoelectric conversion elements 52A and 52B are oriented in a direction opposite to that of the external magnetic field MY, the sensitivities of the first and second magnetoelectric conversion elements 52A and 52B become K+β. In addition, since the sensitivity-influencing axes ED of the third and fourth magnetoelectric conversion elements 52C and 52D are oriented in a direction equal to that of the external magnetic field MY, the sensitivities of the third and fourth magnetoelectric conversion elements 52C and 52D become K−β. Therefore, the sensitivity, K+β, acts on the resistance value $R_1'$ of the first magnetoelectric conversion element 52A in the increasing direction, and the sensitivity, K+β, acts on the resistance value $R_2'$ of the second magnetoelectric conversion element 52B in the decreasing direction. In addition, the sensitivity, K−β, acts on the resistance value $R_3'$ of the third magnetoelectric conversion element 52C in the decreasing direction, and the sensitivity, K−β, acts on the resistance value $R_4'$ of the fourth magnetoelectric conversion element 52D in the increasing direction.

In addition, as described above, the first half-bridge circuit HBc is configured using the first and third magnetoelectric conversion elements 52A and 52C, and the second half-bridge circuit HBd is configured using the second and fourth magnetoelectric conversion elements 52B and 52D. Therefore, the output voltage $V_1'$ of the first half-bridge circuit HBc and the output voltage $V_2'$ of the second half-bridge circuit HBd are expressed as the following Expression (5).

$$V_1' = \frac{R_3'}{R_1' + R_3'}V \quad (5)$$
$$= \frac{R_3[1 - (K - \beta)X]}{R_1[1 + (K + \beta)X] + R_3[1 - (K - \beta)X]}V$$
$$= \frac{1 - KX + \beta X}{2 + 2\beta X}V$$

-continued $$V'_2 = \frac{R'_4}{R'_2 + R'_4}V$$

$$= \frac{R_4[1-(K-\beta)X]}{R_2[1-(K+\beta)X]+R_4[1+(K-\beta)X]}V$$

$$= \frac{1+KX-\beta X}{2-2\beta X}V$$

In addition, by performing a differential operation on the output voltage $V_1'$ of the first half-bridge circuit HBc and the output voltage $V_2'$ of the second half-bridge circuit HBd, it is possible to obtain an output signal as illustrated in the following Expression (6).

$$V'_1 - V'_2 = \frac{1-KX+\beta X}{2+2\beta X}V - \frac{1+KX-\beta X}{2-2\beta X}V \quad (6)$$

$$= \frac{-KX}{(1+\beta X)(1-\beta X)}V$$

In this way, in a case where the magnetoelectric conversion elements having the sensitivity-influencing axes are used in the configuration illustrated in the comparative example, it is difficult to cancel a β dependence property, and the external magnetic field MY has an influence.

On the other hand, in the configuration of the present embodiment illustrated in FIG. 7C, in a case where magnetoelectric conversion elements having sensitivity-influencing axes are used, it is possible to reduce the influence of the external magnetic field MY applied in the sensitivity-influencing axis directions of the magnetoelectric conversion elements. In the present embodiment, the first half-bridge circuit HB1 is configured using the first magnetoelectric conversion element 13A and the second magnetoelectric conversion element 13B, and the second half-bridge circuit HB2 is configured using the third magnetoelectric conversion element 13C and the fourth magnetoelectric conversion element 13D. In this bridge circuit, the resistance values $R_1'$ to $R_4'$ of the first to fourth magnetoelectric conversion elements 13A to 13D are expressed as the following Expression (7). Here, R indicates a resistance value, K indicates a sensitivity, β indicates the amount of change in the sensitivity, X indicates the amplitude of a magnetic field, and $R_0$ indicates the resistance value of a zero magnetic field. In addition, +ΔR indicates a resistance increase rate, and −ΔR indicates a resistance decrease rate.

$$R'_1 = R_1 + \varDelta R \quad (7)$$
$$= R_1 + R_1(K+\beta)X$$
$$= R_1[1+(K+\beta)X]$$
$$R'_2 = R_2 - \varDelta R$$
$$= R_2 - R_2(K+\beta)X$$
$$= R_2[1-(K+\beta)X] \quad \begin{bmatrix} R_1 = R_2 = R_3 = R_4 = R_0 \\ \text{sensitivity} = K+\beta \text{ or } K-\beta \end{bmatrix}$$
$$R'_3 = R_3 - \varDelta R$$
$$= R_3 - R_3(K-\beta)X$$
$$= R_3[1-(K-\beta)X]$$
$$R'_4 = R_4 + \varDelta R$$
$$= R_4 + R_4(K-\beta)X$$
$$= R_4[1+(K-\beta)X]$$

In this case, the resistance values $R_1'$ to $R_4'$ of the individual magnetoelectric conversion elements 13A to 13D change in the same way as the comparative example illustrated in FIG. 7B.

In addition, as described above, the first half-bridge circuit HB1 is configured using the first and second magnetoelectric conversion elements 13A and 13B, and the second half-bridge circuit HB2 is configured using the third and fourth magnetoelectric conversion elements 13C and 13D. Therefore, the output voltage $V_1'$ of the first half-bridge circuit HB1 and the output voltage $V_2'$ of the second half-bridge circuit HB2 are expressed as the following Expression (8).

$$V'_1 = \frac{R'_1}{R'_1 + R'_2}V \quad (8)$$

$$= \frac{R_1[1-(K+\beta)X]}{R_1[1+(K+\beta)X]+R_2[1-(K+\beta)X]}V$$

$$= \frac{1+(K+\beta)X}{2}V$$

$$V'_2 = \frac{R'_3}{R'_3 + R'_4}V$$

$$= \frac{R_3[1-(K-\beta)X]}{R_3[1-(K-\beta)X]+R_4[1+(K-\beta)X]}V$$

$$= \frac{1-(K-\beta)X}{2}V$$

In this case, resistance value fluctuation components in the output voltages $V_1'$ and $V_2'$, caused by the external magnetic field MY, equally become (βXV/2).

In addition, by performing a differential operation on the output voltage $V_1'$ of the first half-bridge circuit HB1 and the output voltage $V_2'$ of the second half-bridge circuit HB2, it is possible to obtain an output signal as illustrated in the following Expression (9).

$$V'_1 - V'_2 = \frac{1+(K+\beta)X}{2}V - \frac{1-(K-\beta)X}{2}V = KXV \quad (9)$$

In this way, in the configuration illustrated in the present embodiment, it is possible to cancel a β dependence property, and the external magnetic field MY has no influence.

Furthermore, the bridge circuit is configured using the first half-bridge circuit HB1 and the second half-bridge circuit HB2. Therefore, even in the magnetoelectric conversion elements 13 such as GMR elements each having an offset in a relationship between a magnetic field and a voltage, it is possible to more accurately cancel out the voltage fluctuations of sensitivity-influencing axis direction components (Y-axis direction components, here) in the bridge circuit.

Using a synthetic resin material containing magnetic powder, as illustrated in FIG. 1, FIG. 2, FIG. 3, and FIG. 6, the magnetic shielding member 15 may be formed in a tube shape and incorporated so that the surrounding inner wall thereof is provided on the outer side of the U-like shape of the current path 12. In addition, when existing on the right side of the plane of paper, the external magnetic field MX illustrated in FIG. 6 passes through this magnetic shielding member 15 and passes out to the left side of the plane of paper while not illustrated in detail. In this way, the external magnetic field MX entering the magnetoelectric conversion elements 13 mainly from the sensitivity axis directions KD is blocked. From this, even in a case where the generation source of a disturbance magnetic field exists near the current sensor 101, it is possible to block the external magnetic field MX in the sensitivity axis direction KD, which has the most influence on a sensitivity.

In addition, while not illustrated in detail, a large part of the external magnetic field MY in the Y-axis direction passes through this magnetic shielding member 15 and passes out from the upper side of the plane of paper to the lower side thereof. However, since the magnetic shielding member 15 has an aperture portion 15k, part of the external magnetic field MY in the Y-axis direction is incident upon the magnetoelectric conversion elements 13 without being blocked. However, the intensity of the external magnetic field MY changes, depending on a distance from the aperture portion 15k of the magnetic shielding member 15, and the external magnetic field MY is aligned in the Y-axis direction if moving far away from the aperture portion 15k. From this, the external magnetic fields MY of the same amplitude are incident upon the respective magnetoelectric conversion elements 13 (13A and 13B, or 13C and 13D) configuring each of the first half-bridge circuit HB1 and the second half-bridge circuit HB2, in approximately parallel with each other. From this, even in a case where the directions and intensities of external magnetic fields incident upon the plural magnetoelectric conversion elements 13 differ substantially while, for example, the generation source of the external magnetic fields exits near the plural magnetoelectric conversion elements 13, the voltage fluctuations of sensitivity-influencing axis direction components in the bridge circuit or the half-bridge circuits are cancelled out, and it is possible to obtain the current sensor 101 whose detection accuracy is further enhanced. In particular, there is high usefulness in a current sensor for a battery management system in which high accuracy for current detection is desired.

In addition, the manufacture of the magnetic shielding member 15 is easily performed by dispersing flat magnetic powder in a synthetic resin such as acrylonitrile butadiene styrene (ABS) or polypropylene (PP) and using injection molding or the like. In addition, since the longitudinal directions of a plurality of flat magnetic powders are oriented so as to be arranged in a form of being aligned in the surface direction of the magnetic shielding member 15, the magnetic shielding effect of the magnetic shielding member 15 is enhanced.

In the substrate 19, a generally known double-sided printed wiring board is used, and a wiring pattern is formed by patterning a metal foil such as copper (Cu), provided on a base substrate, in a base substrate of an epoxy resin containing glass. As illustrated in FIG. 1 and FIG. 2, the magnetic sensor package 14 is mounted in the substrate 19, and the substrate 19 is provided on the current path 12 so that the magnetic sensor package 14 overhangs both the arm portions of the U-like shape of the current path 12. In other words, the substrate 19 is directly attached to the current path 12 and not through the chassis 11. In addition, while the printed wiring board formed of the epoxy resin containing glass is used as the substrate 19, the substrate 19 is not limited to this, and may be, for example, a ceramic wiring board or a flexible wiring board.

As illustrated in FIG. 1 to FIG. 3, the chassis 11 is configured using the upper case 11A formed in a box shape and a lower case 11D whose cross-section is formed in a U-like shape. In addition, the chassis 11 contains the current path 12, the magnetic shielding member 15, the substrate 19 in which the magnetic sensor package 14 is mounted, the magnetic shielding member 15, and the supporting member 52 so as to sandwich, between the upper case 11A and the lower case 11D, the current path 12, the magnetic shielding member 15, the substrate 19 in which the magnetic sensor package 14 is mounted, the magnetic shielding member 15, and the supporting member 52. In addition, the magnetic shielding member 15 and the supporting member 52 are contained so that part of the magnetic shielding member 15 and part of the supporting member 52 protrude from the chassis 11. In addition, in the same way as the supporting member 52, the chassis 11 utilizes a synthetic resin material such as acrylonitrile butadiene styrene (ABS), and is manufactured using injection molding or the like.

From the above, in the current sensor 101 of the first embodiment of the present invention, the sensitivity axes of the individual magnetoelectric conversion elements 13 configuring each of the half-bridge circuits HB1 and HB2 are oriented in a same direction, and induction magnetic fields caused by the current flowing through the current path 12 are applied to the individual magnetoelectric conversion elements 13 in directions opposite to each other. Therefore, the fluctuations of electric potentials in the output voltages of the individual half-bridge circuits HB1 and HB2 become large, and it is possible to obtain a large output signal. In addition, since the sensitivity axes of the individual magnetoelectric conversion elements 13 in the first half-bridge circuit HB1 are oriented in a direction opposite to that of the sensitivity axes of the individual magnetoelectric conversion elements 13 in the second half-bridge circuit HB2, changes (increases or decreases) in the output voltages (V11 and V12) of the individual half-bridge circuits HB1 and HB2 are opposite to each other. Therefore, it is possible to obtain a larger output signal by performing differential processing. Furthermore, since the sensitivity-influencing axes of the individual magnetoelectric conversion elements 13 are oriented in a same direction in each of the half-bridge circuits HB1 and HB2, it is possible to align the fluctuations of resistance values, caused by the sensitivity-influencing axis direction component of the external magnetic field MY. Therefore, voltage fluctuations caused by the sensitivity-influencing axis direction component of the external magnetic field MY are cancelled out by differential processing, the influence of the external magnetic field MY is reduced, and it is possible to obtain the current sensor 101 whose detection accuracy is good.

In addition, since the magnetic shielding member 15 provided on the outer side of the U-like shape of the current path 12 is included, it is possible to block the external magnetic field MX that has the most influence on a sensitivity and enters from the sensitivity axis direction KD. Furthermore, the intensity of the external magnetic field MY in the Y-axis direction incident from the aperture portion 15k of the magnetic shielding member 15 changes depending on a distance therefrom, and the external magnetic field MY is aligned in the Y-axis direction if moving far away from the aperture portion 15k. From these, the external magnetic fields MY of the same amplitude are incident upon the respective magnetoelectric conversion elements 13 (13A and 13B, or 13C and 13D) configuring each of the first half-bridge circuit HB1 and the second half-bridge circuit HB2, in approximately parallel with each other. From this, even in a case where the external magnetic fields are incident upon the plural magnetoelectric conversion elements 13 while, for example, the generation source of the external magnetic fields exits near the plural magnetoelectric conversion elements 13, the voltage fluctuations of sensitivity-influencing axis direction components in the bridge circuit are cancelled out, and it is possible to obtain the current sensor 101 whose detection accuracy is further enhanced.

Second Embodiment

Figure 9:
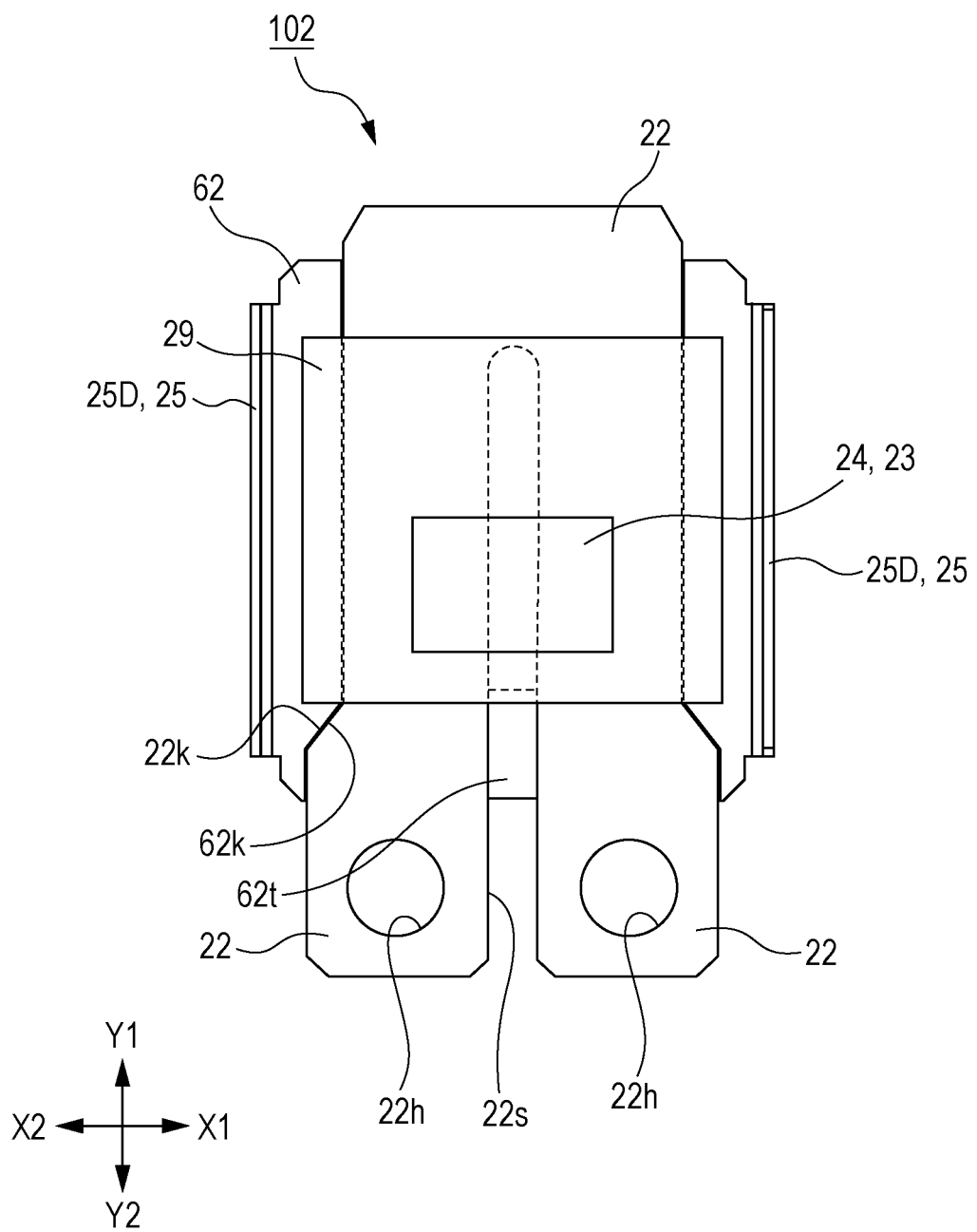
FIG. 9 is a diagram explaining the current sensor of the second embodiment of the present invention, and is a top view viewed from a Z1 side illustrated in FIG. 8.
Figure 10:
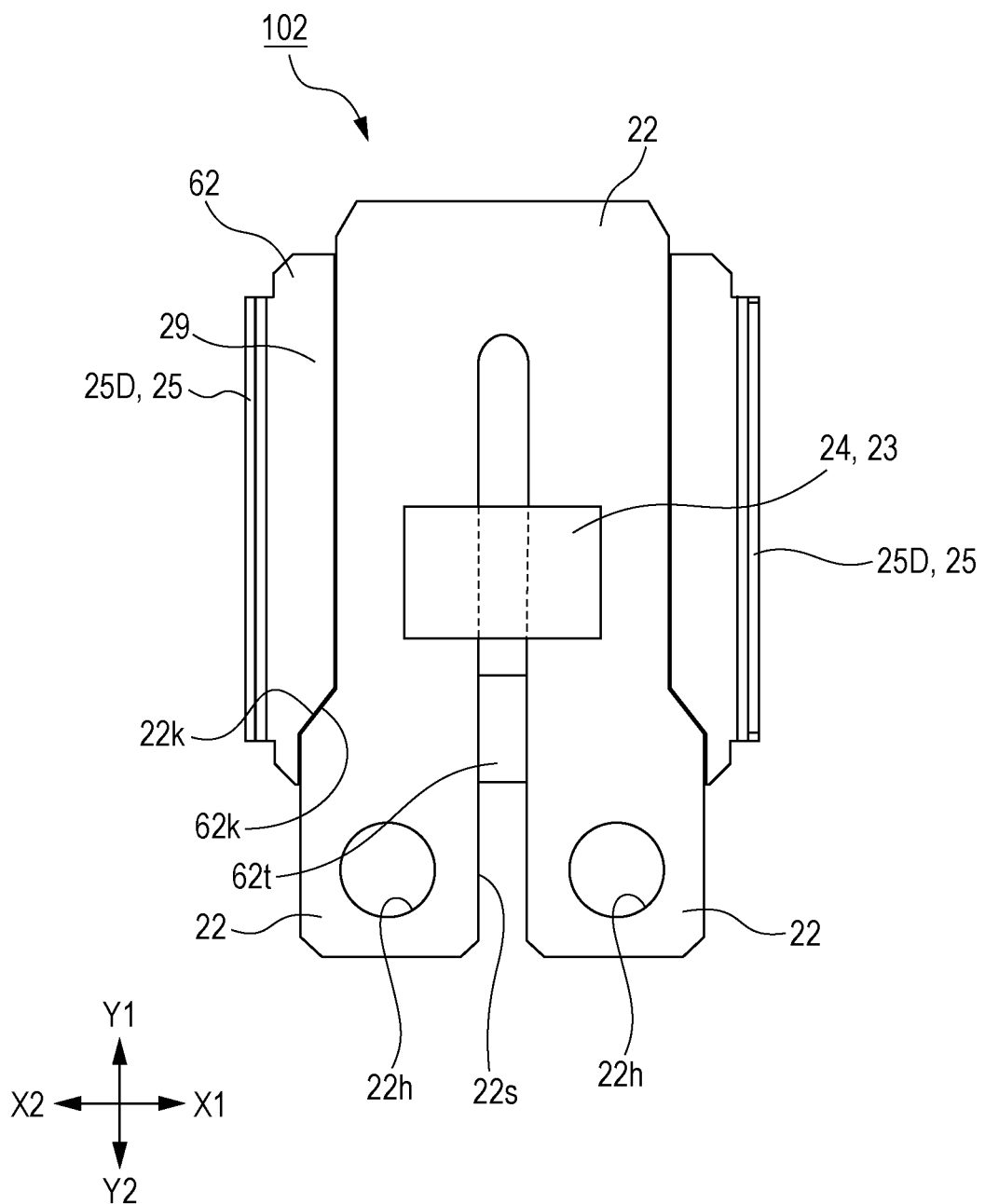
FIG. 10 is a diagram explaining the current sensor of the second embodiment of the present invention, and is a top view in which a substrate in FIG. 9 is omitted.
Figure 11:
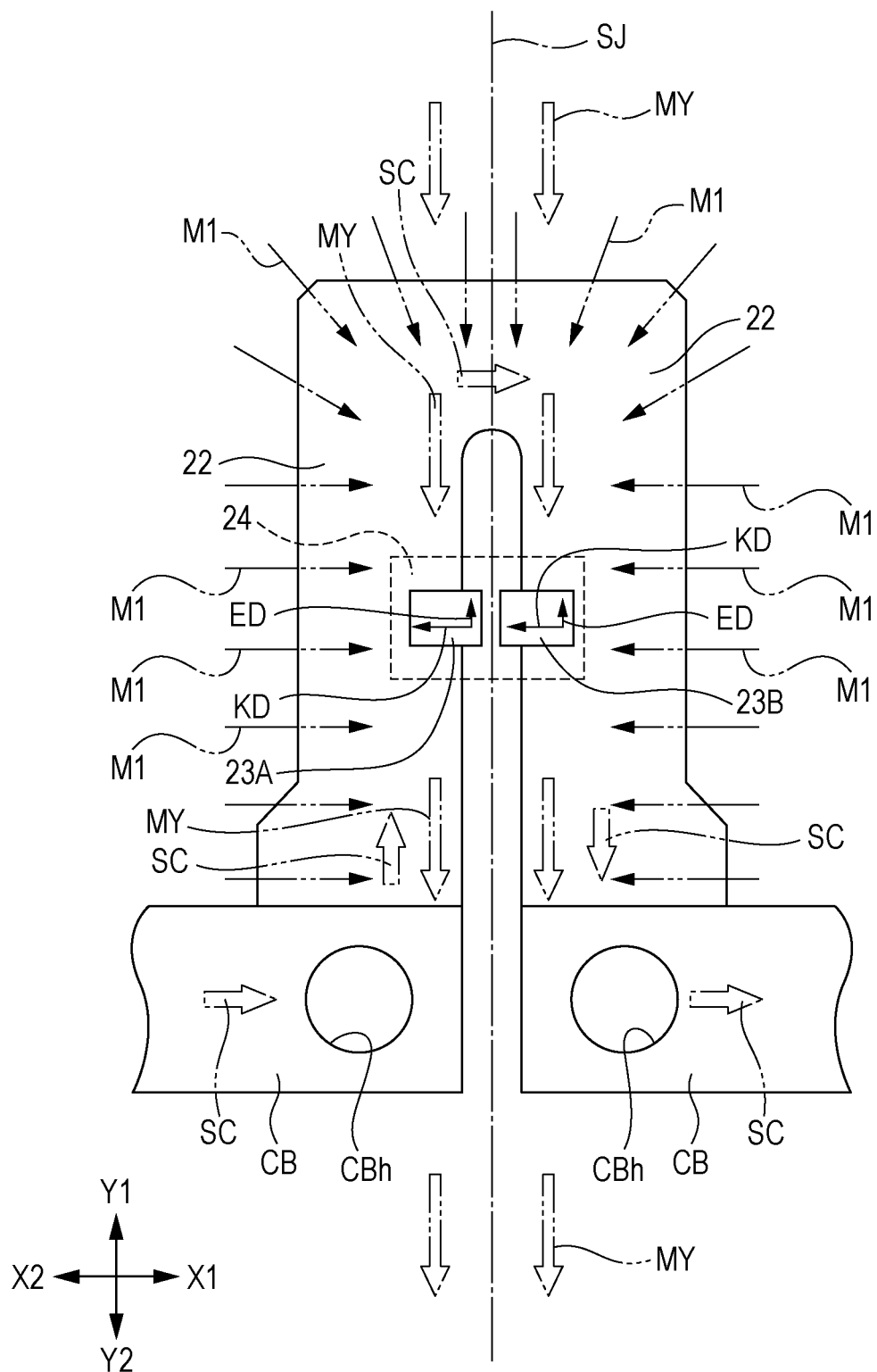
FIG. 11 is a configuration diagram explaining the current sensor of the second embodiment of the present invention, and is a plan view illustrating a current path and magnetoelectric conversion elements.
Figure 12:
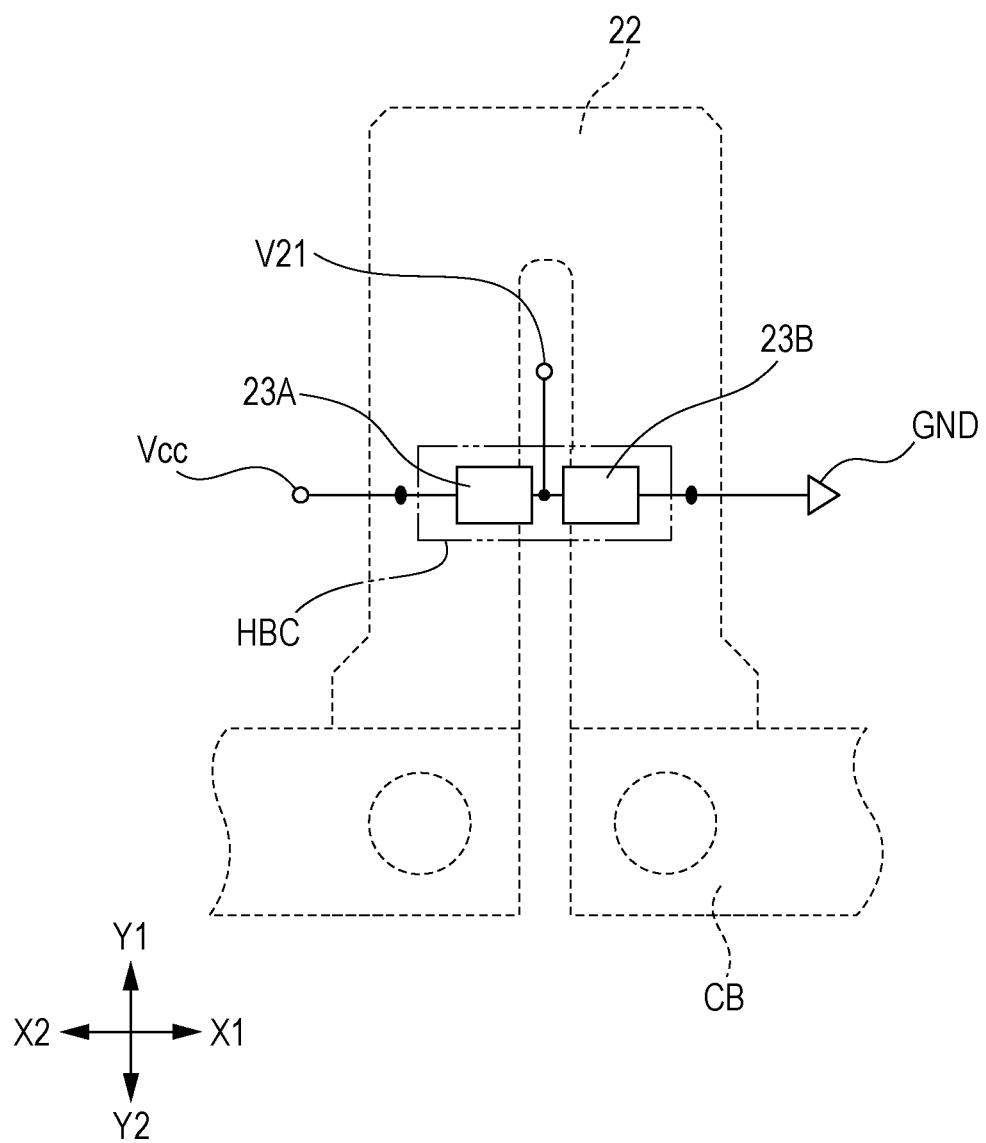
FIG. 12 is a configuration diagram explaining the current sensor of the second embodiment of the present invention, and is a diagram schematically illustrating a bridge circuit in FIG. 11.
Figure 13:
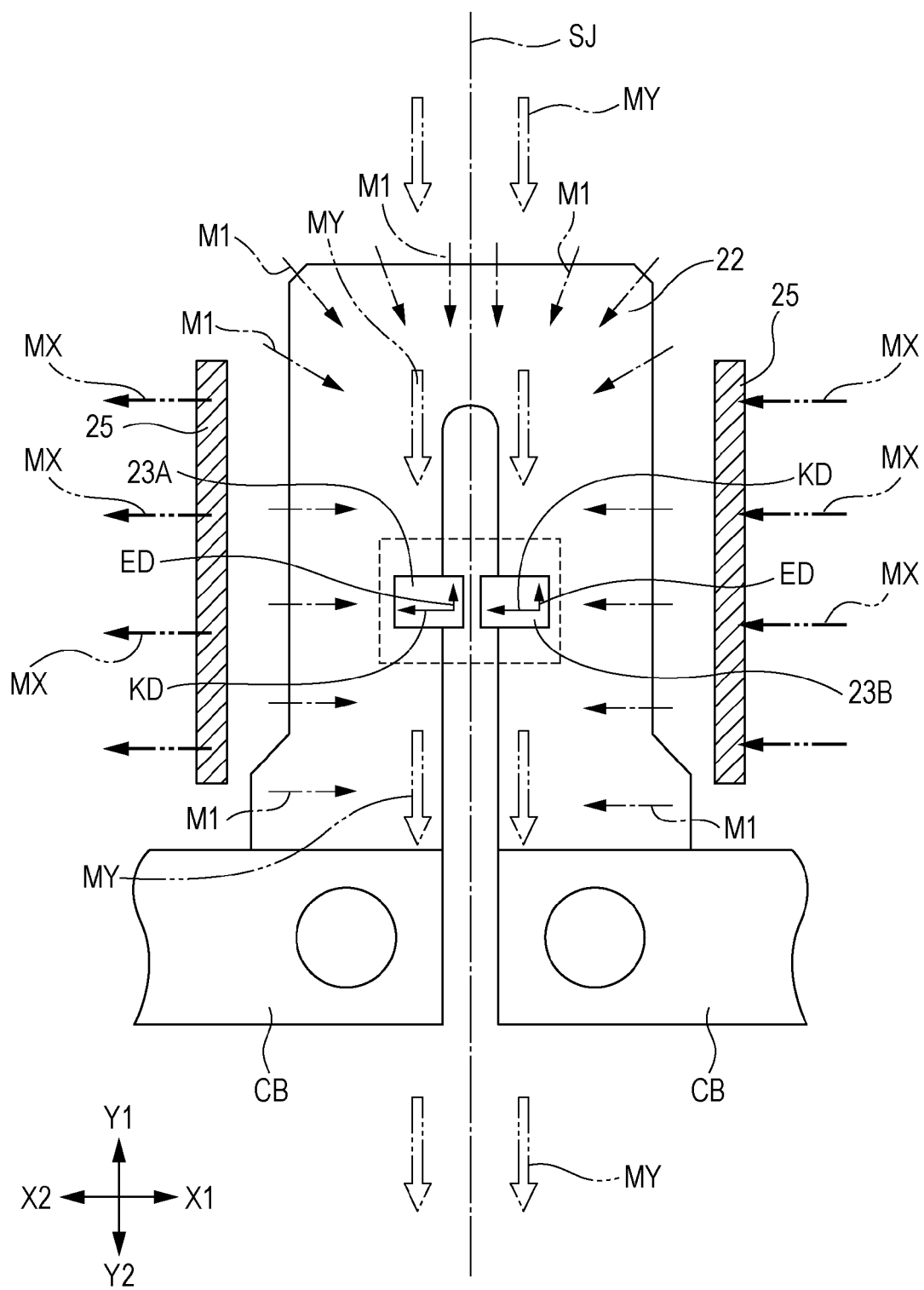
FIG. 13 is a configuration diagram explaining the current sensor of the second embodiment of the present invention, and is a diagram illustrating a magnetic shielding member and external magnetic fields in FIG. 11.

FIG. 8 is an exploded perspective view explaining a current sensor 102 of a second embodiment of the present invention. FIG. 9 is a diagram explaining the current sensor 102 of the second embodiment of the present invention, and is a top view viewed from a Z1 side illustrated in FIG. 8. In addition, for ease of explanation, a magnetic shielding member 25A is omitted. FIG. 10 is a diagram explaining the current sensor 102 of the second embodiment of the present invention, and is a top view in which a substrate 29 in FIG. 9 is omitted. FIG. 11 is a configuration diagram explaining the current sensor of the second embodiment of the present invention, and is a plan view illustrating a current path 22 and magnetoelectric conversion elements 23. FIG. 12 is a configuration diagram explaining the current sensor of the second embodiment of the present invention, and is a diagram schematically illustrating a bridge circuit in FIG. 11. FIG. 13 is a configuration diagram explaining the current sensor of the second embodiment of the present invention, and is a diagram illustrating magnetic shielding members 25 and external magnetic fields (MX and MY) in FIG. 11. Note that, for ease of explanation, the magnetic shielding members 25 are illustrated using only the cross-sections thereof. In addition, the current sensor 102 of the second embodiment is different from the first embodiment in the configurations of the magnetoelectric conversion elements 23 and the magnetic shielding members 25. In addition, a same symbol is assigned to the same configuration as that of the first embodiment, and the description thereof will be omitted.

As illustrated in FIG. 8 to FIG. 11, the current sensor 201 of the first embodiment of the present invention includes the current path 22 having a U-like shape whose one end is open, a plurality of magnetoelectric conversion elements 23 for detecting magnetism generated when a current flows through the current path 22, a circuit (not illustrated) configured to establish connection between the plural magnetoelectric conversion elements 23, and the magnetic shielding members 25 (25A and 25D) provided on the outer side of the U-like shape of the current path 22. In addition to these, the substrate 29 having a wiring pattern for establishing connection between the plural magnetoelectric conversion elements 23 and a supporting member 62 for positioning and supporting the current path 22 are provided.

The current path 22 utilizes a material such as copper (Cu) whose conductivity is good, and has the U-like shape whose one end is open as illustrated in FIG. 8 to FIG. 10, and holes 22h for connecting and being fixed to a current path to be measured (a current path intended to be measured) CB illustrated in FIG. 11 are provided on the leading end side of the U-like shape. While not illustrated, connection and fixation of the current path 22 to the current path to be measured CB are able to be easily achieved by overlaying holes CBh on a current path to be measured CB side and the holes 22h of the current path 22 on each other and using bolts and nuts or the like. In addition, while copper (Cu) is used as the material of the current path 22, the material of the current path 12 is not limited to this, a material whose conductivity is good may be used, and, for example, aluminum (Al), iron (Fe), or the like may be used.

In addition, the current path 22 is contained in the groove of the supporting member 62, inclined portions 22k formed on the right and left outer side portions of the current path 22 and inclined walls 62k formed on the right and left inner side portions of the supporting member 62 are caused to come into contact with each other, a projecting portion 62t of the supporting member 62 is fitted into a slit portion 22s of the current path 22, and thus, the positioning of the current path 22 is accurately performed.

In addition, the supporting member 62 utilizes a synthetic resin material such as acrylonitrile butadiene styrene (ABS), polyethylene terephthalate (PET), polybutylene terephthalate (PBT), or liquid crystalline polymer (LCP). Since the synthetic resin material is used, the supporting member 62 is able to be easily manufactured using injection molding or the like.

The magnetoelectric conversion elements 23 are elements that each detect magnetism generated when a current flows through the current path 22, and two magnetoelectric conversion elements 23 are provided using, for example, magnetic resistance elements, as illustrated in FIG. 11. In addition, while, for ease of explanation, the two magnetoelectric conversion elements 23 (23A and 23B) are not illustrated in detail, a chip of the magnetic resistance elements and lead terminals for extracting a signal are electrically connected to each other, subjected to packaging using a thermosetting synthetic resin, and formed into a magnetic sensor package 24 illustrated in FIG. 8. In addition, the magnetic sensor package 24 is soldered to the substrate 29 by lead terminals not illustrated, and provided astride the slit portion 22s of the U-like shape of the current path 22.

In addition, as illustrated in FIG. 11, a first magnetoelectric conversion element 23A and a second magnetoelectric conversion element 23B out of the plural magnetoelectric conversion elements 23 may be individually provided so as to sandwich therebetween a symmetric axis SJ of the U-like shape of the current path 22. In addition, as illustrated in FIG. 11, the sensitivity axis directions KD of the first magnetoelectric conversion element 23A and the second magnetoelectric conversion element 23B may be oriented in a same direction (an X2 direction in FIG. 11), and the sensitivity-influencing axis directions ED of the first magnetoelectric conversion element 23A and the second magnetoelectric conversion element 23B may be oriented in a same direction (a Y1 direction in FIG. 11). In addition, while, in the second embodiment, a case where an angle between the sensitivity axis direction KD and the sensitivity-influencing axis direction ED is 90 degrees has been described, the angle is not limited to 90 degrees.

The two magnetoelectric conversion elements 23 (23A and 23B) provided as above are electrically connected, and such a circuit as illustrated in FIG. 12 is created. As illustrated in FIG. 12, this circuit may configure a half-bridge circuit HBC using the first magnetoelectric conversion element 23A and the second magnetoelectric conversion element 23B. In addition, while not illustrated, individual terminal portions are connected to an input terminal, a ground terminal, and a signal (output) terminal, and function as a control power-supply voltage Vcc, a ground GND, and an output voltage V21, and the circuit is configured as illustrated in FIG. 12.

According to this, in the current sensor of the present invention, the sensitivity axes of the individual magnetoelectric conversion elements configuring the half-bridge circuit are oriented in a same direction, and induction magnetic fields caused by a current flowing through a pair of arm portions are applied to the individual magnetoelectric conversion elements in directions opposite to each other. Therefore, the fluctuation of an electric potential in the output voltage of the half-bridge circuit becomes large, and it is possible to obtain a large output signal. Furthermore, since the sensitivity-influencing axes of the individual magnetoelectric conversion elements configuring the half-bridge circuit are oriented in a same direction, it is possible to align the amplitudes of resistance value fluctuations dependent on the sensitivity-influencing axis direction component of the external magnetic field in the pair of magnetoelectric conversion elements within the half-bridge circuit. In other words, since the resistance values of the individual magnetoelectric conversion elements are influenced by the external magnetic field in the same way, a ratio between the resistance values of the individual magnetoelectric conversion elements is hardly influenced by the external magnetic field. Therefore, the output voltage V21 is hardly influenced by the external magnetic field.

Using a synthetic resin material containing magnetic powder, the magnetic shielding members 25 are configured with two members of case-like shapes as illustrated in FIG. 8, and part of the current path 22, part of the supporting member 62, the substrate 29, and the magnetic sensor package 24 are enclosed with the upper magnetic shielding member 25A and the lower magnetic shielding member 25D, as illustrated in FIG. 8 to FIG. 10. Therefore, the inner walls of the magnetic shielding members 25 are provided on the outer side of the U-like shape of the current path 22. In addition, when existing on the right side of the plane of paper, an external magnetic field MX illustrated in FIG. 13 passes through the magnetic shielding members 25 and passes out to the left side of the plane of paper while not illustrated in detail. In this way, the external magnetic field MX entering the magnetoelectric conversion elements 23 mainly from the sensitivity axis directions KD is blocked. From this, even in a case where the generation source of a disturbance magnetic field exists near the current sensor 101, it is possible to block the external magnetic field MX in the sensitivity axis direction KD, which has the most influence on a sensitivity.

In addition, while not illustrated in detail, a large part of the external magnetic field MY in the Y-axis direction passes through the magnetic shielding members 25 and passes out from the upper side of the plane of paper to the lower side thereof. However, since a gap is included in a portion of the magnetic shielding members 25, part of the external magnetic field MY in the Y-axis direction is incident upon the magnetoelectric conversion elements 23 without being blocked. However, the intensity of the external magnetic field MY changes, depending on a distance from the gap of the sidewalls of the magnetic shielding members 25, and the external magnetic field MY is aligned in the Y-axis direction if moving far away from the gap of the sidewalls. From this, the external magnetic fields MY of the same amplitude are incident upon the respective magnetoelectric conversion elements 23 (23A and 23B) configuring the half-bridge circuit HBC, in approximately parallel with each other.

In addition, a magnetic sheet in which flat magnetic powder is dispersed in a synthetic resin such as acrylonitrile butadiene styrene (ABS) or polypropylene (PP) is subjected to a bending process and formed into a desired shape, and thus, the manufacture of the magnetic shielding members 25 is easily performed. In addition, since the longitudinal directions of a plurality of flat magnetic powders are oriented so as to be arranged in a form of being aligned in the surface direction of the magnetic sheet, the magnetic shielding effect of the magnetic sheet is enhanced.

In the substrate 29, a generally known single-sided printed wiring board is used, and a wiring pattern is formed by patterning a metal foil such as copper (Cu), provided on a base substrate, in a base substrate of an epoxy resin containing glass. As illustrated in FIG. 8 and FIG. 9, the magnetic sensor package 24 is mounted in the substrate 29, and the substrate 29 is provided on the current path 22 so that the magnetic sensor package 24 overhangs both the arm portions of the U-like shape of the current path 22. In other words, the substrate 29 is directly attached to the current path 22 and not through the magnetic shielding members 25. In addition, while the printed wiring board formed of the epoxy resin containing glass is used as the substrate 29, the substrate 29 is not limited to this, and may be, for example, a ceramic wiring board or a flexible wiring board.

From the above, in the current sensor 102 of the second embodiment of the present invention, the sensitivity axes of the first magnetoelectric conversion element 23A and the second magnetoelectric conversion element 23B configuring the half-bridge circuit HBC are oriented in a same direction, and induction magnetic fields caused by the current flowing through the pair of arm portions are applied to the individual magnetoelectric conversion elements 23A and 23B in directions opposite to each other. Therefore, the fluctuation of an electric potential in the output voltage of the half-bridge circuit HBC becomes large, and it is possible to obtain a large output signal. Furthermore, since the sensitivity-influencing axes of the individual magnetoelectric conversion elements 23A and 23B configuring the half-bridge circuit HBC are oriented in a same direction, it is possible to align the fluctuations of resistance values dependent on the sensitivity-influencing axis direction component of the external magnetic field, in the individual magnetoelectric conversion elements 23A and 23B within the half-bridge circuit HBC.

In addition, since the magnetic shielding members 25 provided on the outer side of the U-like shape of the current path 22 are included, it is possible to block the external magnetic field MX that has the most influence on a sensitivity and enters from the sensitivity axis direction KD. Furthermore, the intensity of the external magnetic field MY in the Y-axis direction incident from the longitudinal direction of the current path changes depending on a distance thereof, and the external magnetic field MY is aligned in the Y-axis direction if moving far away from the outer side of the magnetic shielding members 25. From these, the external magnetic fields MY of the same amplitude are incident upon the respective magnetoelectric conversion elements 23 (23A and 23B) configuring the half-bridge circuit HBC, in approximately parallel with each other.

In addition, the present invention is not limited to the above-mentioned embodiments, and may be modified and implemented, for example, as follows, and these embodiments belong to the technical scope of the present invention.

Figure 14:
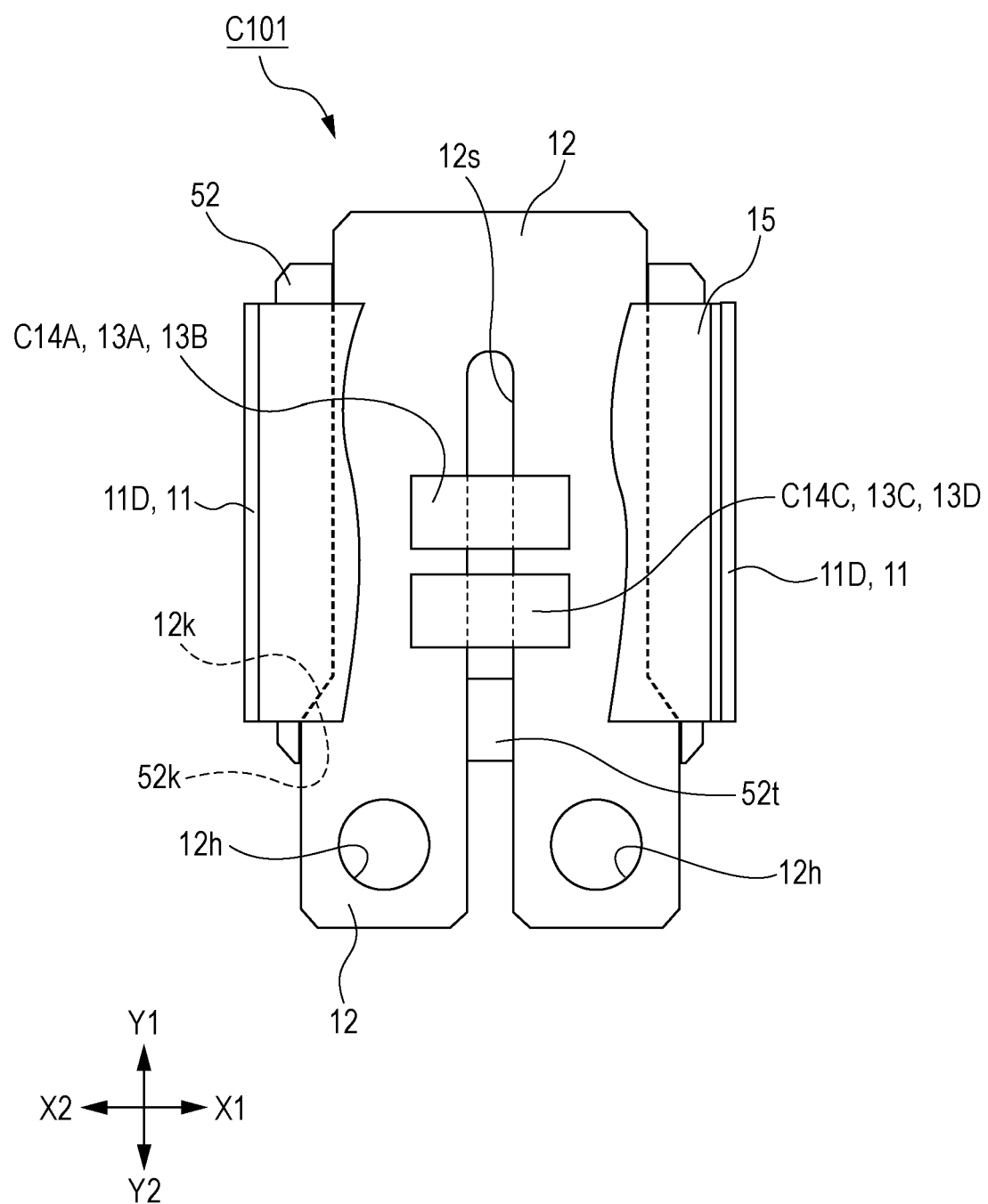
FIG. 14 is a top view explaining a first example of a modification to the current sensor of the first embodiment of the present invention, and is a diagram compared with FIG. 3.
Figure 15:
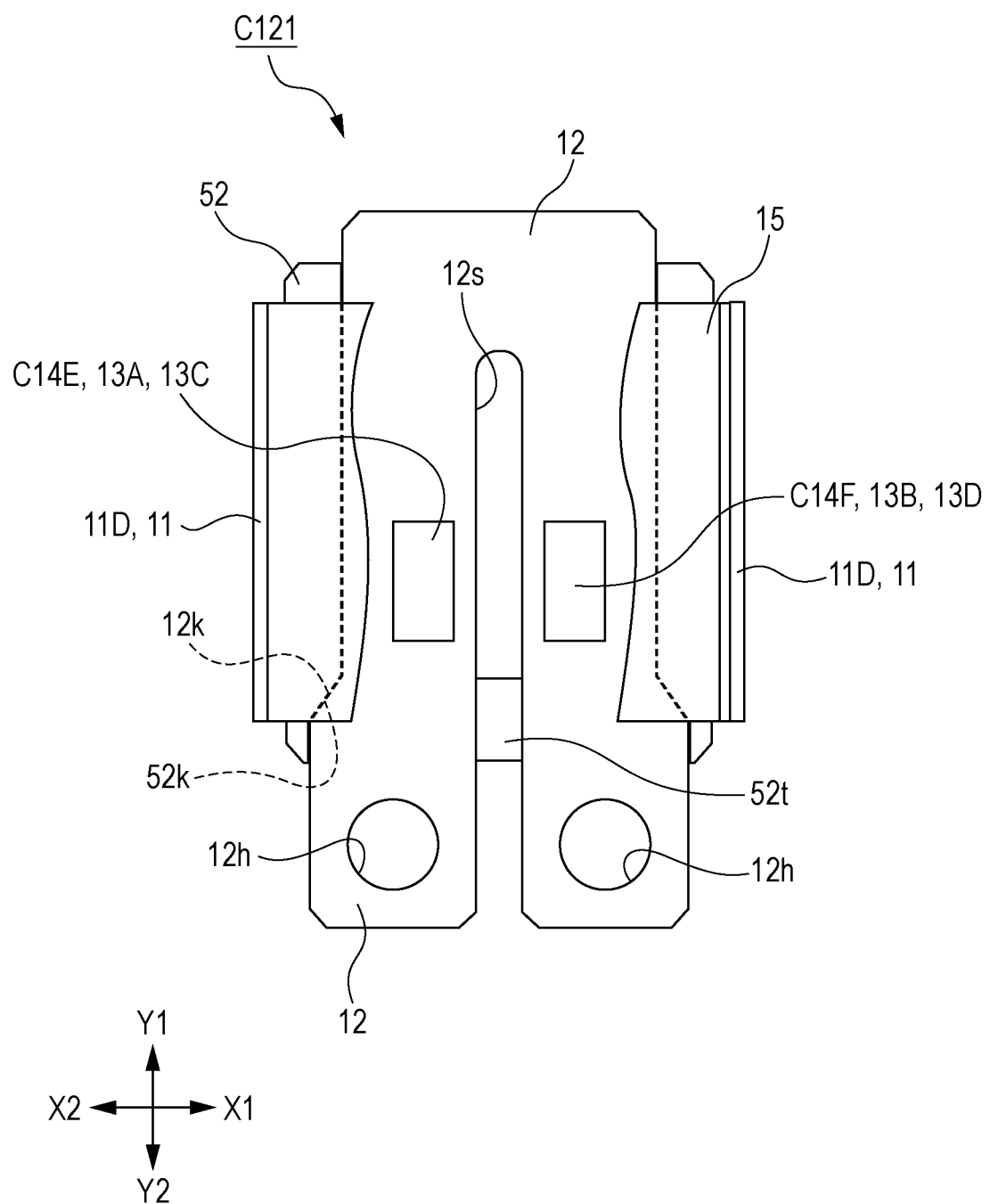
FIG. 15 is a top view explaining a second example of a modification to the current sensor of the first embodiment of the present invention, and is a diagram compared with FIG. 3.
Figure 16:
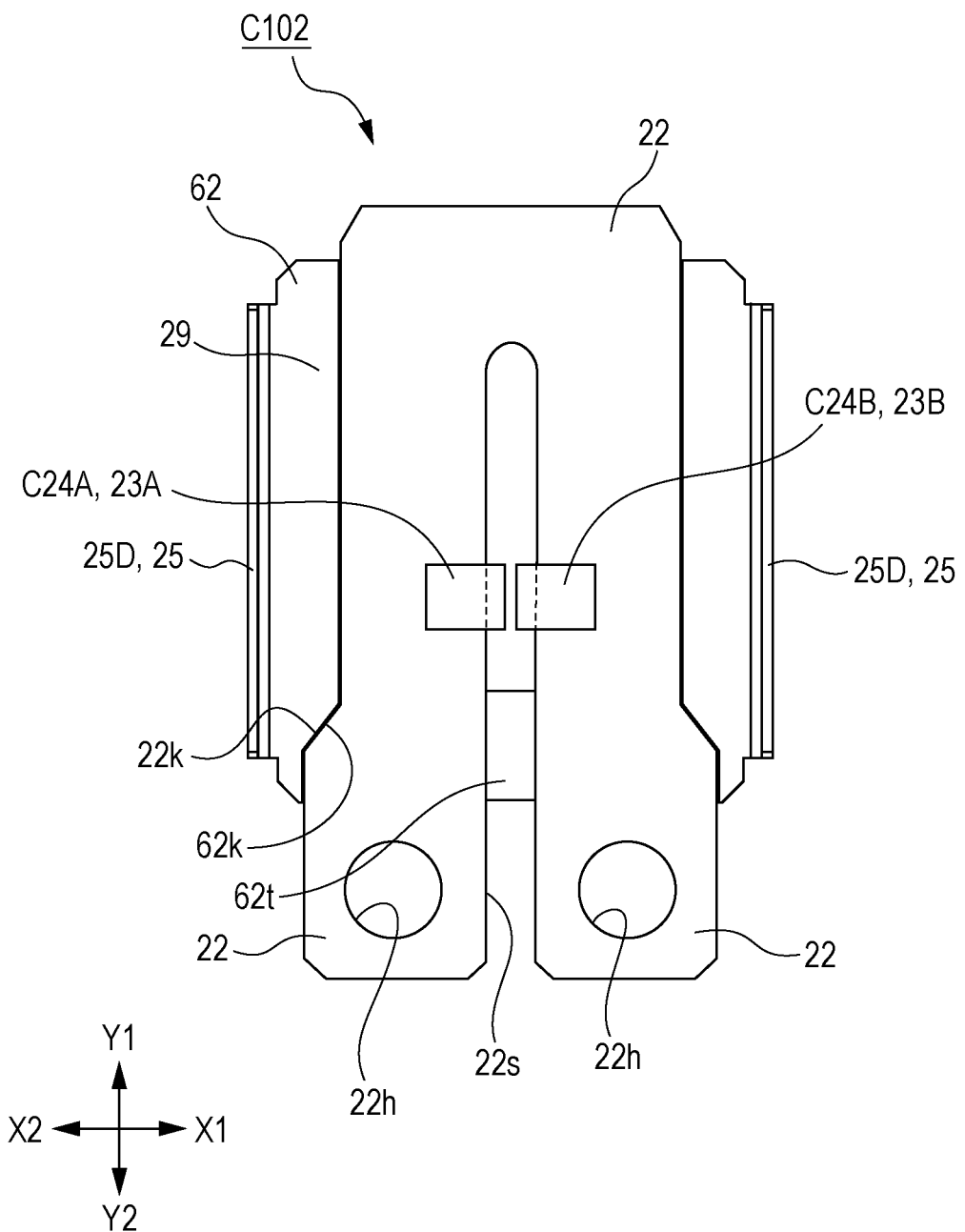
FIG. 16 is a top view explaining a fourth example of a modification to the current sensor of the second embodiment of the present invention, and is a diagram compared with FIG. 10.
Figure 17:
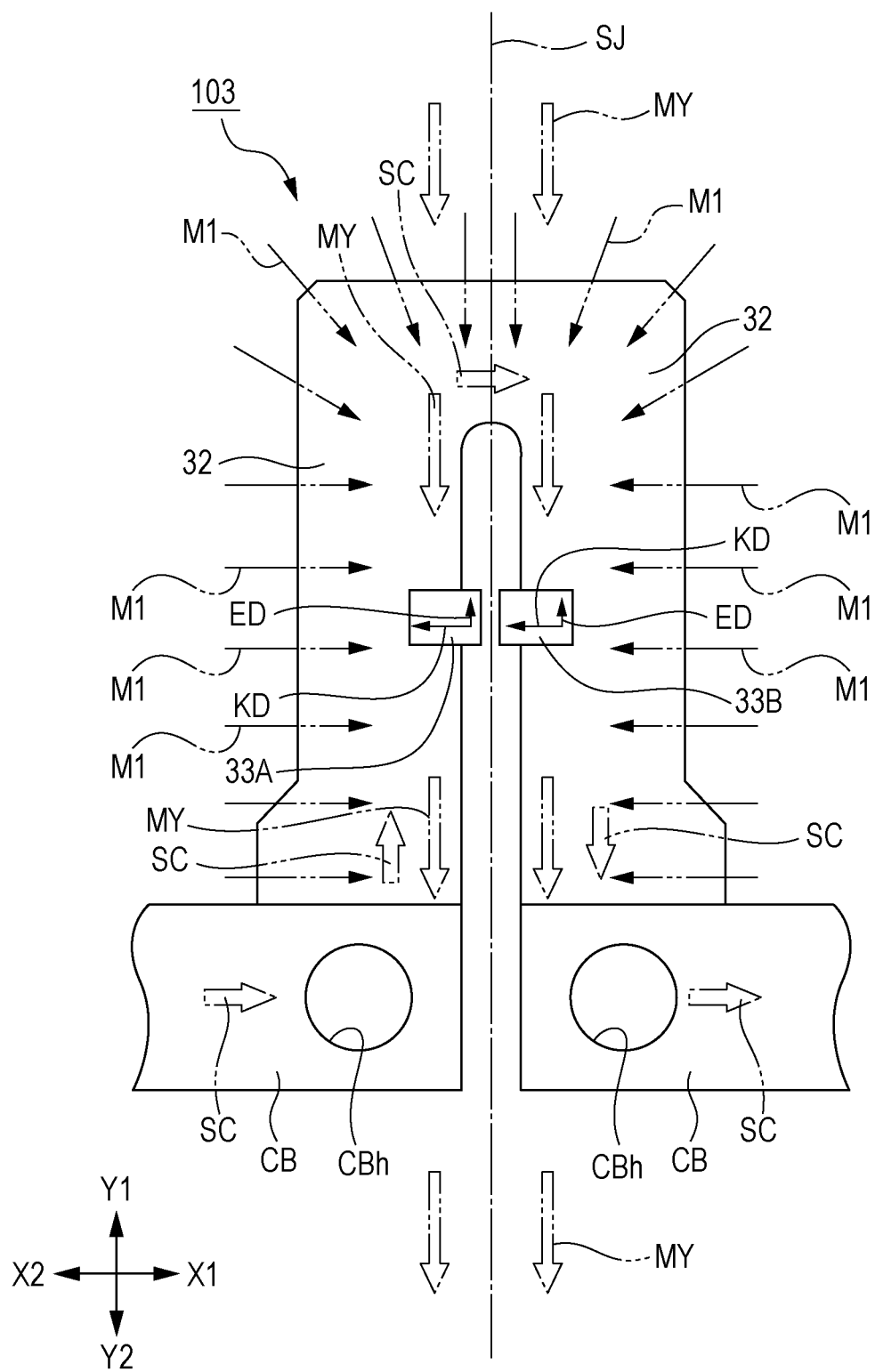
FIG. 17 is a top view explaining an eighth example of a modification to the current sensor of the first or second embodiment of the present invention.
Figure 18A:
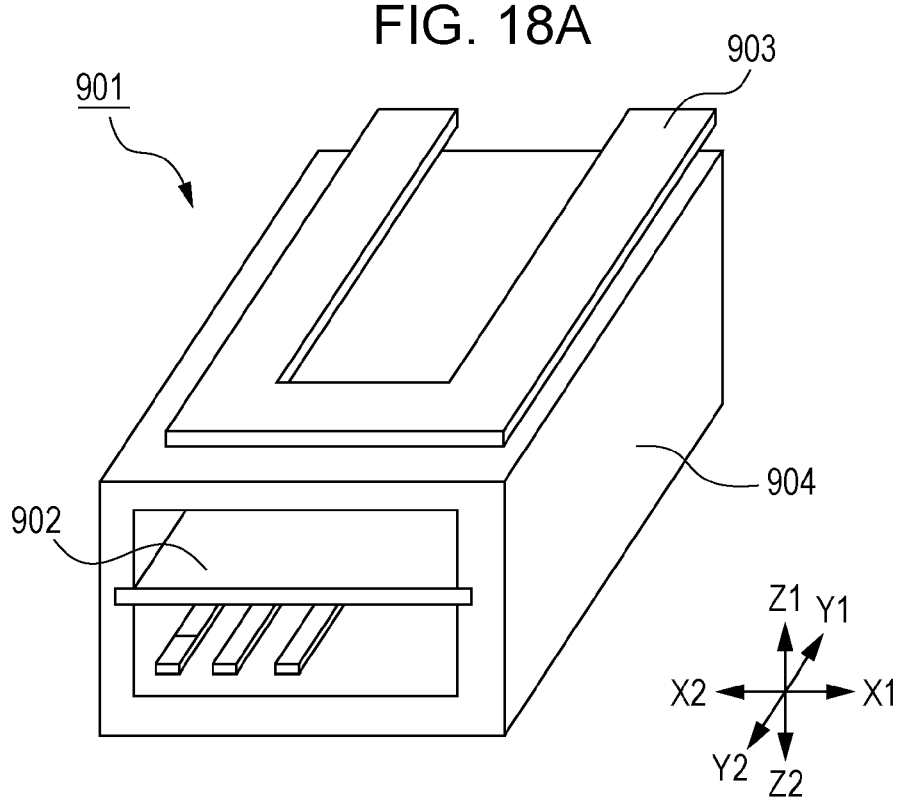
FIGS. 18A and 18B are diagrams explaining a current sensor of the related art.
Figure 18B:
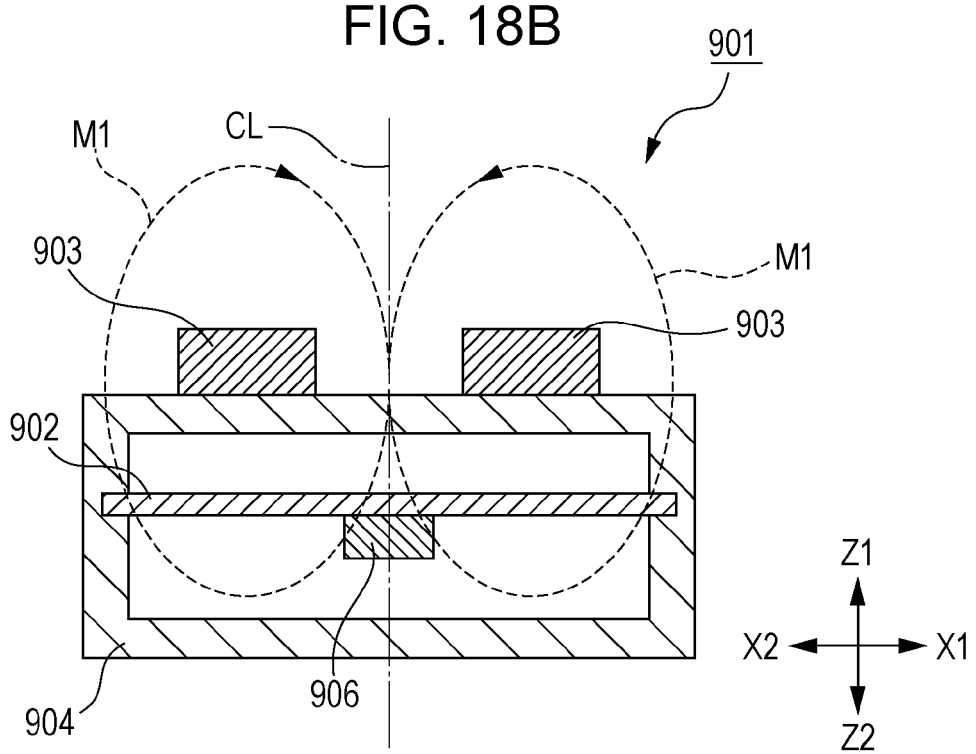
Figure 19A:
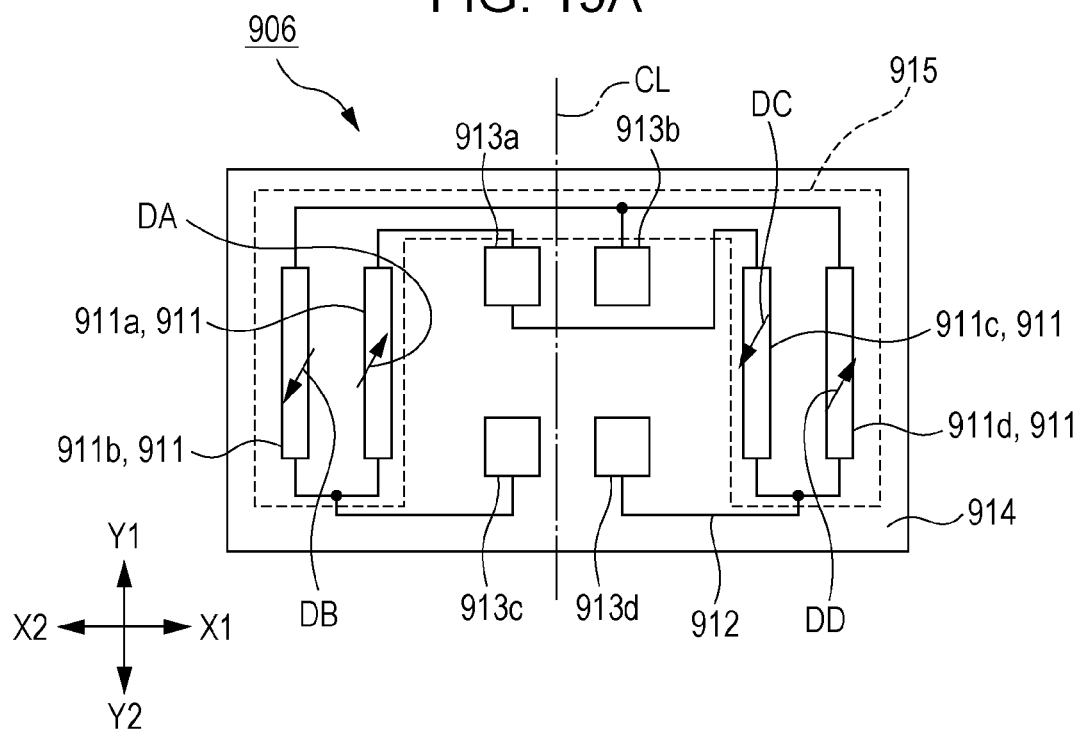
FIGS. 19A and 19B are diagrams explaining the current sensor of the related art.
Figure 19B:
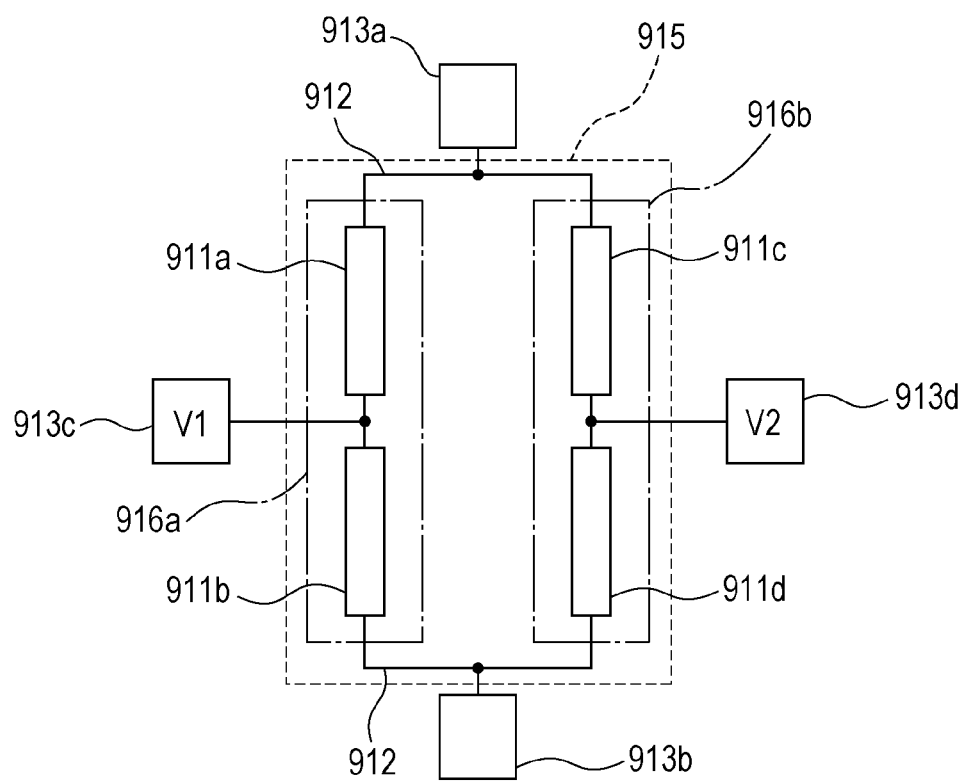
Figure 20:
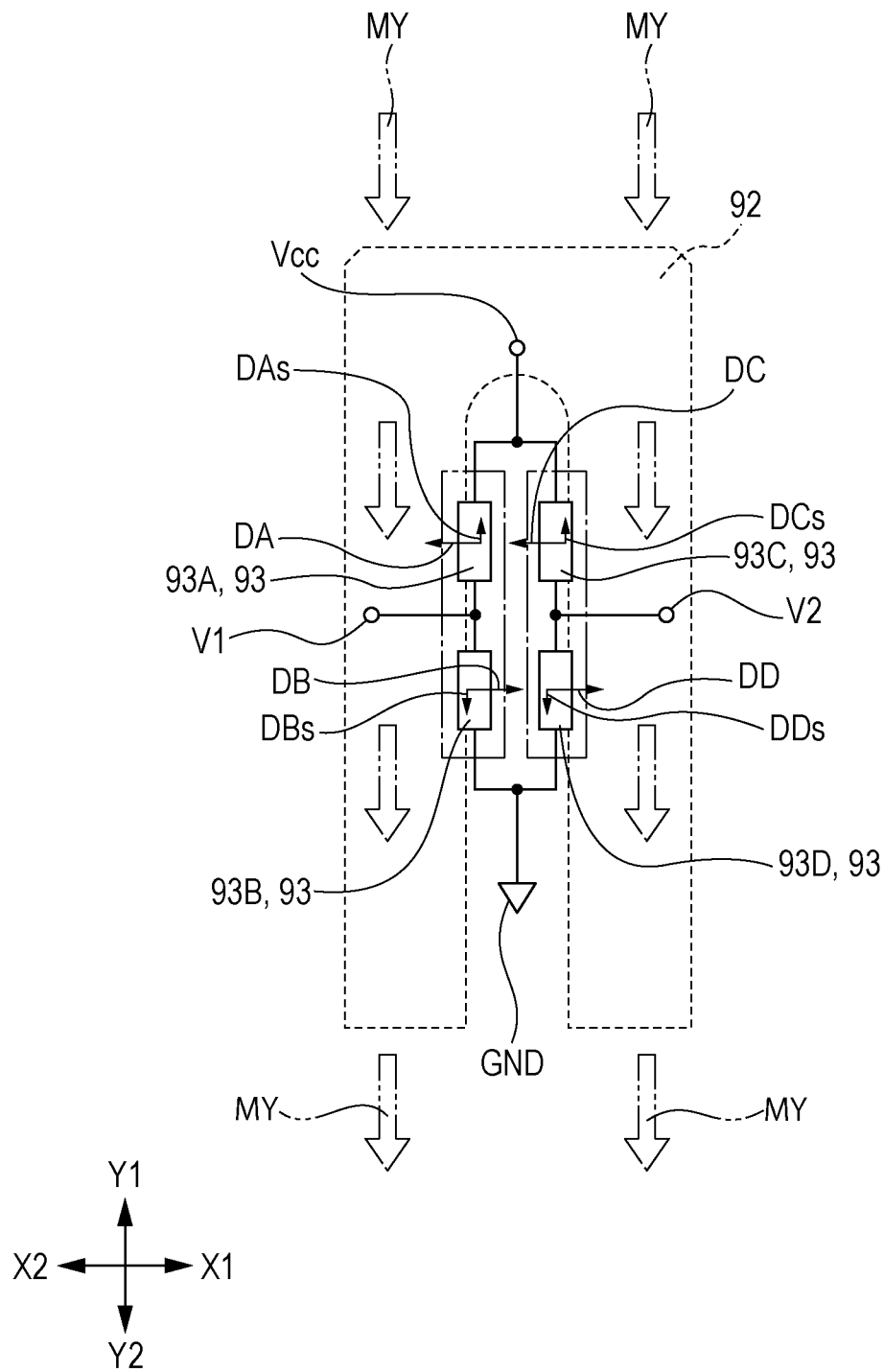
FIG. 20 is a diagram explaining a comparative example, and is a schematic configuration diagram compared based on a bridge circuit of the current sensing device portion illustrated in FIG. 19B.

FIG. 14 is a top view explaining a current sensor C101 serving as a first example of a modification to the current sensor 101 of the first embodiment of the present invention, and is a diagram compared with FIG. 3. FIG. 15 is a top view explaining a current sensor C121 serving as a second example of a modification to the current sensor 101 of the first embodiment of the present invention, and is a diagram compared with FIG. 3. FIG. 16 is a top view explaining a current sensor C102 serving as a fourth example of a modification to the current sensor 102 of the second embodiment of the present invention, and is a diagram compared with FIG. 10. FIG. 17 is a top view explaining a current sensor C103 serving as an eighth example of a modification to the current sensor 101 or 102 of each embodiment of the present invention.

First Example of Modification

While the above-mentioned first embodiment adopts a configuration in which the four magnetoelectric conversion elements 13 are put into one package, the first magnetoelectric conversion element 13A and the second magnetoelectric conversion element 13B may be put into one package to form a magnetic sensor package C14A and the third magnetoelectric conversion element 13C and the fourth magnetoelectric conversion element 13D may be put into one package to form a magnetic sensor package C14C, as illustrated in FIG. 14.

Second Example of Modification

While the above-mentioned first embodiment adopts a configuration in which the four magnetoelectric conversion elements 13 are put into one package, the first magnetoelectric conversion element 13A and the third magnetoelectric conversion element 13C may be put into one package to form a magnetic sensor package C14E and the second magnetoelectric conversion element 13B and the fourth magnetoelectric conversion element 13D may be put into one package to form a magnetic sensor package C14F, as illustrated in FIG. 15.

Third Example of Modification

While the above-mentioned first embodiment adopts a configuration in which a tube-shaped compact utilizing a synthetic resin material containing magnetic powder is adopted as the magnetic shielding member 15, a configuration in which a magnetic shielding layer is provided by applying flat magnetic powder dispersed in a binder and a solvent to a tube-shaped compact utilizing a synthetic resin material and hardening the flat magnetic powder, the flat magnetic powder containing no magnetic powder, may be adopted. At that time, the magnetic shielding layer may be provided in one of the whole circumference of the inner side and the whole circumference of the outer side of the tube-shaped compact. In addition, the magnetic shielding layer may be provided in the inner wall of the chassis 11 and used as a magnetic shielding member without using the magnetic shielding member 15.

Fourth Example of Modification

While the above-mentioned second embodiment adopts a configuration in which the two magnetoelectric conversion elements 23 are put into one package, the first magnetoelectric conversion element 23A may be put into one package to form a magnetic sensor package C24A and the second magnetoelectric conversion element 23B may be put into one package to form a magnetic sensor package C24B, as illustrated in FIG. 16.

Fifth Example of Modification

While, in each of the above-mentioned embodiments, a type in which the cross-sectional shape of the current path (12 or 22) is a rectangular plate-like shape, that is, a so-called bus bar type, is used, a current path of a type of an electric wire whose cross-sectional shape is a circular shape or an elliptical shape. In addition, while, in each of the above-mentioned embodiments, a configuration in which the current path (12 or 22) is formed in a U-like shape is exemplified, a configuration is not limited to this configuration. It is only necessary for the current path (12 or 22) to be formed in a folded shape including a pair of arm portions extending in parallel with each other. In addition, the pair of arm portions is not limited to being perfectly parallel with each other. In other words, a range in which the detection accuracy of the current sensor is improved includes an extent of being able to be regarded as substantially parallel with each other.

Sixth Example of Modification

While, in each of the above-mentioned embodiments, the magnetic shielding member (15 or 25) is suitably used, a configuration not including the magnetic shielding member (15 or 25) may be adopted.

Seventh Example of Modification

While being oriented in directions opposite to each other in the above-mentioned first embodiment, the sensitivity-influencing axes of the magnetoelectric conversion elements 13 in the first half-bridge circuit HB1 and the sensitivity-influencing axes of the magnetoelectric conversion elements 13 in the second half-bridge circuit HB2 may be oriented in a same direction. In other words, it is only necessary for the sensitivity-influencing axes to be oriented in a same direction within a same half-bridge circuit.

Eighth Example of Modification

While, in each of the above-mentioned embodiments, magnetic resistance elements are used as the magnetoelectric conversion elements, Hall elements may be used as illustrated in FIG. 17. In this current sensor 103, a substrate (not illustrated) is attached on a current path 32 of a U-like shape. On the substrate, a pair of magnetoelectric conversion elements 33 (33A and 33B) is located above the arm portions of the current path 32 so as to sandwich therebetween a symmetric axis SJ of the U-like shape of the current path 32. In addition, the pair of magnetoelectric conversion elements 33 may be subjected to packaging in the same way as in the above-mentioned individual embodiments. In addition, the sensitivity axis directions KD of the first magnetoelectric conversion element 33A and the second magnetoelectric conversion element 33B are oriented in a same direction (the X2 direction). In addition, the sensitivity-influencing axis directions ED of the first magnetoelectric conversion element 33A and the second magnetoelectric conversion element 33B are oriented in a same direction (the Y1 direction). In addition, while a case where an angle between the sensitivity axis direction KD and the sensitivity-influencing axis direction ED is 90 degrees has been described, the angle is not limited to 90 degrees.

In this current sensor 103, when the current to be measured SC is applied and the induction magnetic fields M1 are generated, the sensitivity axis directions KD of the first magnetoelectric conversion element 33A and the second magnetoelectric conversion element 33B are oriented in a same direction. Therefore, the induction magnetic fields M1 applied in the sensitivity axis direction KD of the first magnetoelectric conversion element 33A and the sensitivity axis direction KD of the second magnetoelectric conversion element 33B are oriented in directions opposite to each other. Therefore, changes (increases or decreases) in the respective electric potentials of the output voltage of the first magnetoelectric conversion element 33A and the output voltage of the second magnetoelectric conversion element 33B are opposite to each other. Therefore, it is possible to obtain a large output signal by performing differential processing.

In addition, in a case where the external magnetic field MY in the Y-axis direction is incident, the sensitivity-influencing axis directions ED of the first magnetoelectric conversion element 33A and the second magnetoelectric conversion element 33B are oriented in a same direction. Therefore, it is possible to align the fluctuation amounts of output signals caused by the influence of the external magnetic field MY. Therefore, voltage fluctuations caused by the sensitivity-influencing axis direction component of the external magnetic field are cancelled out by differential processing, the influence of the external magnetic field is reduced, and it is possible to obtain the current sensor 103 whose detection accuracy is good. In addition, in the current sensor 103 utilizing the Hall elements, it is possible to provide a magnetic shielding member in the same way as in each of the above-mentioned embodiments.

The present invention is not limited to the above-mentioned embodiments, and may be arbitrarily modified without departing from the scope of the present invention.

What is claimed is:

1. A current sensor comprising:
   a U-shaped current path including a pair of arm portions extending in parallel to each other, the current path having a symmetry axis thereof extending between the pair of arm portions;
   a first pair of magnetoelectric conversion elements provided so as to sandwich the symmetry axis therebetween, the pair of magnetoelectric conversion elements being configured to detect magnetism caused by a current passing through the pair of arm portions, the first pair of magnetoelectric conversion elements being connected in series to form a first half-bridge circuit such that a signal is extracted from a connection point of the pair of magnetoelectric conversion elements; and
   a second pair of magnetoelectric conversion elements which form a second half-bridge circuit,
   wherein the first and second half-bridge circuits are connected in parallel to form a full-bridge circuit,
   wherein the first pair of magnetoelectric conversion elements have respective sensitivity axes oriented in a same first direction, and respective sensitivity-influencing axes oriented in a same second direction,
   and wherein the second pair of magnetoelectric conversion elements have respective sensitivity axes oriented in a direction opposite to the first direction.

2. The current sensor according to claim 1, wherein the second direction is a direction of a bias magnetic field applied to the pair of magnetoelectric conversion elements.

3. The current sensor according to claim 1, further comprising:
   a magnetic shielding member blocking an external magnetic field entering the magnetoelectric conversion elements from the first direction.

* * * * *